(12) United States Patent
Zheng

(10) Patent No.: US 10,510,961 B1
(45) Date of Patent: Dec. 17, 2019

(54) ORGANIC LIGHT EMITTING HOST MATERIALS

(71) Applicant: Nitto Denko Corporation, Osaka (JP)

(72) Inventor: Shijun Zheng, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 1277 days.

(21) Appl. No.: 14/450,149

(22) Filed: Aug. 1, 2014

Related U.S. Application Data

(60) Provisional application No. 61/861,125, filed on Aug. 1, 2013.

(51) Int. Cl.
*H01L 51/00* (2006.01)
*H01L 51/50* (2006.01)

(52) U.S. Cl.
CPC ........ *H01L 51/0052* (2013.01); *H01L 51/006* (2013.01); *H01L 51/0061* (2013.01);
(Continued)

(58) Field of Classification Search
CPC ............... H01L 51/0052; H01L 51/006; H01L 51/0072; H01L 51/0067; H01L 51/0071–51/007; H01L 51/0059; H01L 51/005; H01L 51/0061; H01L 51/5028; H01L 51/5056; H01L 51/5072; H01L 2251/53; C09K 11/06; C09K 2211/1029; C09K 2211/1044; C07D 235/08; C07D 235/18; C07D 209/82; C07D 209/86; C07D 209/862; C07D 235/14; C07D 213/22;
(Continued)

(56) References Cited

U.S. PATENT DOCUMENTS

2007/0205412 A1 9/2007 Bae
2009/0134783 A1 5/2009 Lin
(Continued)

FOREIGN PATENT DOCUMENTS

| JP | 2001023777 | 1/2001 |
|---|---|---|
| KR | 2009073852 | 7/2009 |
| KR | 2011047803 | 5/2011 |

OTHER PUBLICATIONS

Huang, Jinhai et al., Journal of Materials Chemistry (2011), 21(9), 2957-2964.
(Continued)

*Primary Examiner* — Jennifer A Chriss
*Assistant Examiner* — Elizabeth M. Dahlburg
(74) *Attorney, Agent, or Firm* — K&L Gates LLP; Louis C. Cullman; Hal Gibson

(57) ABSTRACT

Disclosed herein are compounds represented by formula:

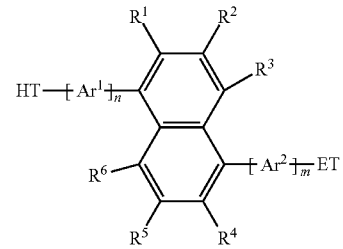

where HT, ET, $Ar^1$, $Ar^2$, and $R^1$-$R^6$ are described herein. Compositions of said compounds along with organic light-emitting diode (OLED) devices related thereto are also disclosed.

10 Claims, 1 Drawing Sheet

(52) U.S. Cl.
CPC ...... *H01L 51/0072* (2013.01); *H01L 51/5028* (2013.01); *H01L 51/5056* (2013.01); *H01L 51/5072* (2013.01); *H01L 2251/53* (2013.01)

(58) Field of Classification Search
CPC .. C07D 215/06; C07D 241/42; C07D 215/12; C07C 15/24
USPC ....... 257/E51.051; 564/431, 433; 548/304.4, 548/310.7, 440, 445
See application file for complete search history.

(56) References Cited

U.S. PATENT DOCUMENTS

2010/0326526 A1  12/2010  Zheng
2011/0140093 A1   6/2011  Zheng

OTHER PUBLICATIONS

Chen, Chih-Hsin et al., Advanced Functional Materials (2009), 19(16), 2661-2670.

| Host | cd/A(lm/w)@1Knit | 2mA@V (ΔV-20 hrs) | T-50@10Knit | T-50(hrs) @1Knit |
|---|---|---|---|---|
| Host 2 | 12.8 (8.5) | 6.2 (0.73) | 70 | 4,416 |
| Host 3 | 9.0 (4.9) | 7.5 (1.11) | 40 | 2,523 |

ORGANIC LIGHT EMITTING HOST MATERIALS

CROSS-REFERENCE TO RELATED APPLICATIONS

This application claims the benefit of U.S. Provisional Application 61/861,125, filed Aug. 1, 2013, which is incorporated by reference in its entirety herein.

FIELD

The present disclosure generally relates to the field of organic chemistry and organic light emitting diodes (OLED). More particularly, the present disclosure is development of host material for use in OLED devices.

BACKGROUND

OLED is a flat light emitting technology which utilizes organic thin films placed between two conductors in order to create light. When an electrical current is applied between the two conductors a bright light is emitted. OLED technology has many implementations, including displays, such as televisions, and has been utilized in solid state lighting (SSL) applications. A primary benefit of OLED technology as compared to previous technologies is that OLED technology is more efficient, requiring less electrical consumption, and also allows for space saving because OLED devices can be made very thin.

It is generally considered that a white OLED device, in order to qualify as SSL, it may be helpful to achieve greater than 100 lm with color rendering index (CRI) greater than 70 and operating time greater than 10,000 hours at 1000 cd/cm². To accomplish this, it would be helpful to have a host material capable of supplying such results. Most host materials in existence have problems with low stability, high charge injection barrier, and imbalanced charge injection and mobilities. All of these problems lead to a high turn-on voltage and short device lifetime. In order to achieve high efficiency, low turn-on voltage, and long device lifetime, it is necessary to create stable, high mobility, bipolar host materials. Achieving these criteria will allow for the realization of the full commercial potential of organic light-emitting devices

SUMMARY

In accordance with the purposes of the present disclosure, as embodied and broadly described herein, the present disclosure includes a compound represented by the following formula:

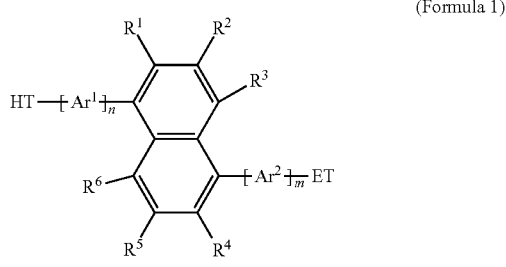

(Formula 1)

In this host compound formula, $R^1$, $R^2$, $R^3$, $R^4$, $R^5$ and $R^6$ are independently H, $C_1$-$C_3$ alkyl, or $C_{1-3}$ perfluoroalkyl; $Ar^1$ and $Ar^2$ are independently optionally substituted 1,4-interphenylene or 1,3-interphenylene, where n is 0, 1, or 2; and m is 0, 1, or 2; HT is optionally substituted carbazolyl, optionally substituted 9-phenylcarbazolyl, optionally substituted phenylnaphthylamine, or optionally substituted diphenylamine; and ET may be optionally substituted benzimidazol-2-yl, optionally substituted benzothiazol-2-yl, optionally substituted benzoxazol-2-yl, optionally substituted 3,3'-bipyridin-5-yl, optionally substituted quinolin-8-yl, optionally substituted quinolin-5-yl, or optionally substituted quinoxalin-5-yl.

Some embodiments include organic light-emitting devices which include a light-emitting layer, said light-emitting layer including a compound described herein.

These and other embodiments are described in greater detail below.

DETAILED DESCRIPTION

Figures 1, 2:
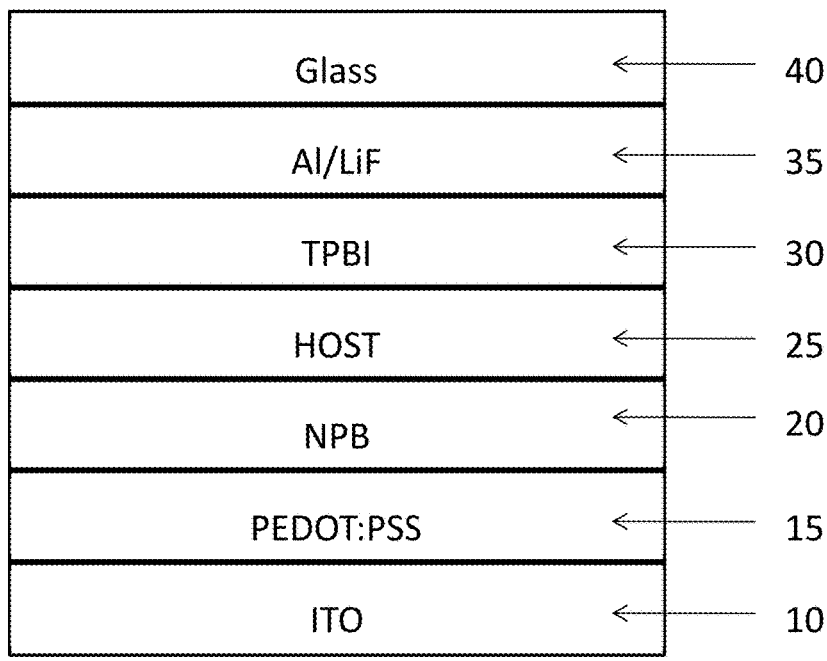
FIG. 1 is a schematic diagram of a device according to some embodiments of the present disclosure.
FIG. 2 is a table showing device data of devices and embodiments of the present disclosure.

As used herein, "optionally substituted" group refers to a group that may be substituted or unsubstituted. A substituted group is derived from the unsubstituted parent structure wherein one or more hydrogen atoms on the parent structure have been independently replaced by one or more substituent groups. A substituted group may have one or more substituent groups on the parent group structure. In some embodiments, the substituent is a halogen, or has from 1-20 carbon atoms, from 1-10 carbon atoms, or has a molecular weight of less than about 500, about 300, or about 200. In some embodiments, the substituent has at least 1 carbon atom or at least 1 heteroatom, and has about 0-10 carbon atoms and about 0-5 heteroatoms independently selected from: N, O, S, F, Cl, Br, I, and combinations thereof. In some embodiments, each substituent consists of about 0-20 carbon atoms, about 0-47 hydrogen atoms, about 0-5 oxygen atoms, about 0-2 sulfur atoms, about 0-3 nitrogen atoms, about 0-1 silicon atoms, about 0-7 fluorine atoms, about 0-3 chlorine atoms, about 0-3 bromine atoms, and about 0-3 iodine atoms. Examples include, but are not limited to, alkyl, alkenyl, alkynyl, carbazolyl, cycloalkyl, cycloalkenyl, cycloalkynyl, aryl, diarylamino, heteroaryl, heteroalicyclyl, aralkyl, heteroaralkyl, (heteroalicyclyl)alkyl, hydroxy, protected hydroxy, alkoxy, aryloxy, acyl, ester, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, protected C-carboxy, O-carboxy, isocyanato, thiocyanato, isothiocyanato, nitro, silyl, sulfenyl, sulfinyl, sulfonyl, haloalkyl, haloalkoxyl, trihalomethanesulfonyl, trihalomethanesulfonamido, and amino, including mono- and di-substituted amino groups, and the protected derivatives thereof. In some embodiments, the substituent groups are independently selected from optionally substituted alkyl, —O-alkyl (e.g. —OCH$_3$, —OC$_2$H$_5$, —OC$_3$H$_7$, —OC$_4$H$_9$, etc.), —S-alkyl (e.g. —SCH$_3$, —SC$_2$H$_5$, —SC$_3$H$_7$, —SC$_4$H$_9$, etc.), —NR'R", —OH, —SH, —CN, —NO$_2$, or a halogen, wherein R' and R" are independently H or optionally substituted alkyl.

The term "alkyl" as used herein refers to a moiety comprising carbon and hydrogen containing no double or triple bonds. Alkyl may be linear, branched, cyclic, or a combination thereof, and contain from one to thirty-five carbon atoms. Examples of alkyl groups include but are not limited to methyl, ethyl, propyl, isopropyl, cyclopropyl, n-butyl, iso-butyl, tert-butyl, cyclobutyl, pentyl isomers, cyclopentane, hexyl isomer, cyclohexane, and the like. The term "linear alkyl" as used herein refers to —(CH$_2$)$_q$CH$_3$, where q is 0-34. The term "C$_{1-10}$ alkyl" as used herein refers to alkyl having from 1 to 10 carbon atoms such as methyl, ethyl, propyl isomers, butyl isomers, cyclobutyl isomers, pentyl isomers, cyclopentyl isomers, hexyl isomers, cyclohexyl isomer, heptyl isomers, cycloheptyl isomers, octyl isomers, cyclooctyl isomers, nonyl isomers, cyclononyl isomers, decyl isomer, cyclodecyl isomers, etc. The term "alkylene" is a subgenus of "alkyl" and refers to a divalent alkyl moiety, e.g. —CH$_2$—, etc.

As used herein, the term "perfluoroalkyl" refers to fluoroalkyl with a formula C$_n$F$_{2n+1}$ for a linear or branched structure, e.g., CF$_3$, C$_2$F$_5$, C$_3$F$_7$, C$_4$F$_9$, C$_5$F$_{11}$, C$_6$F$_{13}$, etc., or C$_n$F$_{2n}$ for a cyclic structure, e.g., cyclic C$_3$F$_6$, cyclic C$_4$F$_8$, cyclic C$_5$F$_{10}$, cyclic C$_6$F$_{12}$, etc. In other words, every hydrogen atom in alkyl is replaced by fluorine. For example, while not intending to be limiting, C$_{1-3}$ perfluoroalkyl refers to CF$_3$, C$_2$F$_5$, and C$_3$F$_7$ isomers.

The term "aryl" refers to the broadest meaning generally understood in the art, and may include an aromatic ring or aromatic ring system such as phenyl, naphthyl, etc. The term "heteroaryl" also has the meaning understood by a person of ordinary skill in the art, and in some embodiments, may refer to an "aryl" which has one or more heteroatoms in the ring or ring system. Examples of "heteroaryl" may include, but are not limited to, pyridinyl, furyl, thienyl, oxazolyl, thiazolyl, imidazolyl, indolyl, quinolinyl, benzofuranyl, benzothienyl, benzoxazolyl, benzothiazolyl, benzoimidazolyl, pyrazinyl, pyrimidinyl, pyridazinyl, triazinyl, quinoxalinyl, quinazolinyl, phthalazinyl, cinnolinyl, isoquinolinyl, pteridinyl, acridinyl, phenazinyl, phenanthrolinyl, tetrazolyl, pyrazolyl, indazolyl, benzimidazolyl, benzotriazolyl, carbazolyl, purinyl, triazolopyridazinyl, triazolopyrimidinyl, tetrazaindenyl, oxadiazolyl, imidazopyridinyl, pyrazolidinyl, pyrrolopyridinyl, thiadiazolopyridinyl, dibenzazepinyl, tribenzazepineyl, As used herein, the term benzimidazol-2-yl refers to the ring system:

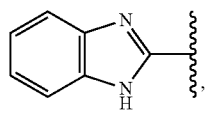

In some embodiments, a benzimidazol-2-yl may be:

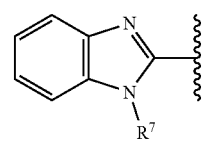

wherein R$^7$ is selected from the group H, C$_1$-C$_3$ alkyl, optionally substituted aryl, including, but not limited to phenyl and naphthal.

As used herein, the term benzoxazol-2-yl refers to the ring system:

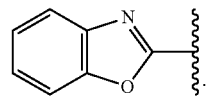 [SMILES: *c1nc2ccccc2o1]

As used herein, the term benzothiazol-2-yl refers to the ring system:

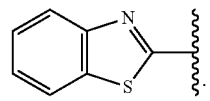

As used herein, the term 3,3'-bipyridin-5-yl refers to the ring system

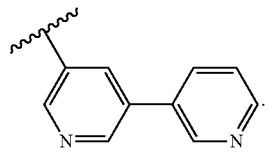 [SMILES: *c1cncc(-c2cccnc2)c1]

As used herein, the term "quinolin-8-yl" refers to the ring system:

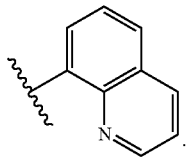 [SMILES: *c1cccc2cccnc12]

As used herein, the term "quinolin-5-yl" refers to the ring system:

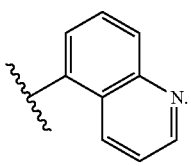 [SMILES: *c1cccc2ncccc12]

As used herein, the term "quinoxalin-5-yl" refers to the ring system:

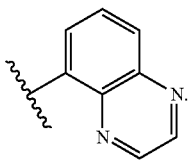 [SMILES: *c1cccc2nccnc12]

As used herein, the term "carbazolyl" refers to the ring system:

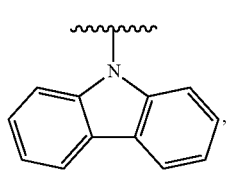 [SMILES: *n1c2ccccc2c2ccccc21]

which includes, but is not limited to:

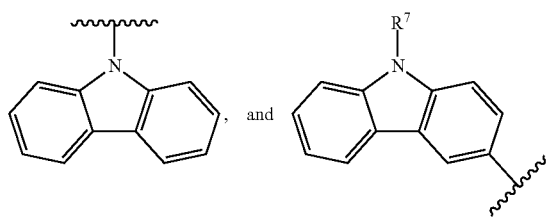

As used herein, the term 9-Phenylcarbazolyl refers to the ring system:

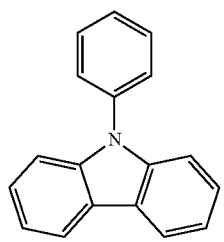 [SMILES: c1ccc(-n2c3ccccc3c3ccccc32)cc1]

As used herein, the term "diphenylamine" refers to the ring system:

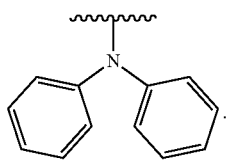 [SMILES: *N(c1ccccc1)c1ccccc1]

As used herein, the term "phenylnaphthylamine" refers to the ring system:

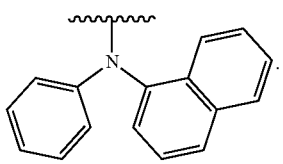 [SMILES: *N(c1ccccc1)c1cccc2ccccc12]

As used herein, the term 1,3 interphenylene refers to the ring system:

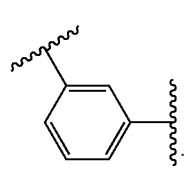

As used herein, the term 1,4 interphenylene refers to the ring system:

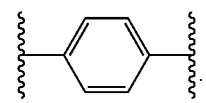

In some embodiments, compounds disclosed herein may be useful in emissive elements in an organic light emitting device (OLED).

Structures associated with some of the chemical names referred to herein are depicted below. These structures may be unsubstituted, as shown below, or a substituent may independently be in any position normally occupied by a hydrogen atom when the structure is unsubstituted. Unless a point of attachment is indicated by

attachment may occur at any position normally occupied by a hydrogen atom or lone pair of electrons.

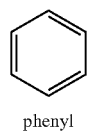

phenyl

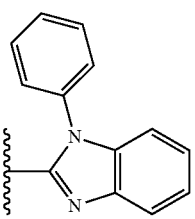

1-phenyl-1H-benzo[d]imidazol-2-yl

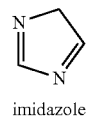

imidazole

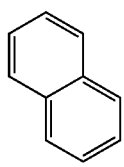

naphthalene

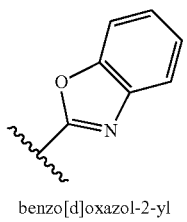 [SMILES: *c1nc2ccccc2o1]

benzo[d]oxazol-2-yl

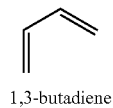

1,3-butadiene

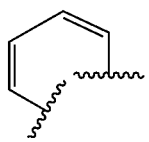

1,3-butadien-1,4-yl

In some embodiments, the compound may be represented by the formula:

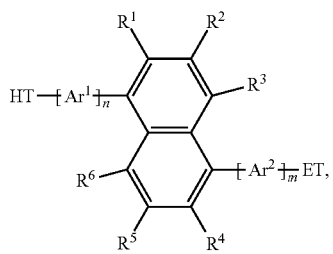

wherein $R^1$, $R^2$, $R^3$, $R^4$, $R^5$ and $R^6$ may be independently selected from H, $C_1$-$C_3$ alkyl, and $C_{1-3}$ perfluoroalkyl.

With respect to formula 1, $Ar^1$ may be optionally substituted 1,4-interphenylene or optionally substituted 1,3-interphenylene. If $Ar^1$ is substituted, it may have 1, 2, 3, or 4 substituents. Any substituent may be included on the $Ar^1$. In some embodiments, some or all of the substituents on the $Ar^1$ may have: from 0 to 10 carbon atoms and from 0 to 10 heteroatoms, wherein each heteroatom is independently: O, N, S, F, Cl, Br, or I (provided that there is at least 1 non-hydrogen atom); and/or a molecular weight of 15 g/mol to 500 g/mol. For example, the substituents may be $C_{1-10}$ optionally substituted alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc., which may be optionally substituted; $C_{1-10}$ optionally substituted alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as —$O_2CCH_3$, —$CO_2CH_3$, —$O_2CC_2H_5$, —$CO_2C_2H_5$, —$O_2C$-phenyl, —$CO_2$-phenyl, etc.; a $C_{1-10}$ ketone such as —$COCH_3$, —$COC_2H_5$, —$COC_3H_7$, —CO-phenyl, etc.; or a $C_{1-10}$ amine such as $NH_2$, $NH(CH_3)$, $N(CH_3)_2$, $N(CH_3)C_2H_5$, etc. In some embodiments, $Ar^1$ is unsubstituted 1,4-interphenylene. In some embodiments, $Ar^1$ is unsubstituted 1,3-interphenylene.

With respect to formula 1, $Ar^2$ may be optionally substituted 1,4-interphenylene or 1,3-interphenylene. If $Ar^2$ is substituted, it may have 1, 2, 3, or 4 substituents. Any substituent may be included on the $Ar^2$. In some embodiments, some or all of the substituents on the $Ar^2$ may have: from 0 to 10 carbon atoms and from 0 to 10 heteroatoms, wherein each heteroatom is independently: O, N, S, F, Cl, Br, or I (provided that there is at least 1 non-hydrogen atom); and/or a molecular weight of 15 g/mol to 500 g/mol. For example, the substituents may be $C_{1-10}$ optionally substituted alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc., which may be optionally substituted; $C_{1-10}$ optionally substituted alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as —$O_2CCH_3$, —$CO_2CH_3$, —$O_2CC_2H_5$, —$CO_2C_2H_5$, —$O_2C$-phenyl, —$CO_2$-phenyl, etc.; a $C_{1-10}$ ketone such as —$COCH_3$, —$COC_2H_5$, —$COC_3H_7$, —CO— phenyl, etc.; or a $C_{1-10}$ amine such as $NH_2$, $NH(CH_3)$, $N(CH_3)_2$, $N(CH_3)C_2H_5$, etc. In some embodiments, $Ar^2$ is unsubstituted 1,4-interphenylene. In some embodiments, $Ar^2$ is unsubstituted 1,3-interphenylene.

In some embodiments, $Ar^1$ is

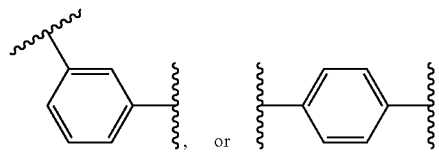 [SMILES: *c1cccc(*)c1 ; *c1ccc(*)cc1]

In some embodiments, $Ar^2$ is

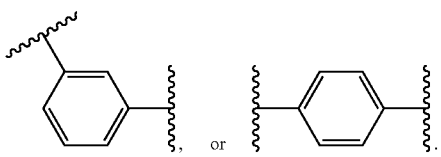 [SMILES: *c1cccc(*)c1 ; *c1ccc(*)cc1]

With respect to Formula 1, n is 0, 1, or 2. In some embodiments, n is 0. In some embodiments, n is 2.

With respect to Formula 1, m is 0, 1, or 2. In some embodiments, m is 1. In some embodiments, m is 2.

With respect to Formula 1, HT may be optionally substituted carbazolyl, optionally substituted 9-phenylcarbazolyl, optionally substituted phenylnaphthylamine, or optionally substituted diphenylamine. If HT is substituted, it may have 1, 2, 3, or 4 substituents. Any substituent may be included on the HT. In some embodiments, some or all of the substituents on the HT may have: from 0 to 10 carbon atoms and from 0 to 10 heteroatoms, wherein each heteroatom is independently: O, N, S, F, Cl, Br, or I (provided that there is at least 1 non-hydrogen atom); and/or a molecular weight of 15 g/mol to 500 g/mol. For example, the substituents may be $C_{1-10}$ optionally substituted alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc., which may be optionally substituted; $C_{1-10}$ optionally substituted alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as —$O_2CCH_3$, —$CO_2CH_3$, —$O_2CC_2H_5$, —$CO_2C_2H_5$, —$O_2C$-phenyl, —$OC_2$-phenyl, etc.; a $C_{1-10}$ ketone such as —$COCH_3$, —$COC_2H_5$, —$COC_3H_7$, —CO-phenyl, etc.; or a $C_{1-10}$ amine such as NH$_2$, NH(CH$_3$), N(CH$_3$)$_2$, N(CH$_3$)C$_2$H$_5$, etc. In some embodiments, the substituents on HT, if present, are electron withdrawing, such as halo, such as F, Cl, Br, I; CN; NO$_2$; C$_{1-6}$ fluoroalkyl, such as CF$_3$, CF$_2$H, C$_2$F$_5$, etc.; C$_{1-10}$ acyl such as —COCH$_3$, —COC$_2$H$_5$, —COC$_3$H$_7$, —CO-phenyl, etc. In some embodiments, HT is C$_6$H$_{13}$, cyclic C$_6$H$_{11}$, etc., which may be optionally substituted; C$_{1-10}$ optionally substituted alkoxy; halo, such as F, Cl, Br, I; OH; CN; NO$_2$; C$_{1-6}$ fluoroalkyl, such as CF$_3$, CF$_2$H, C$_2$F$_5$, etc.; a C$_{1-10}$ ester such as —O$_2$CCH$_3$, —CO$_2$CH$_3$, —O$_2$CC$_2$H$_5$, —CO$_2$C$_2$H$_5$, —O$_2$C-phenyl, —CO$_2$-phenyl, etc.; a C$_{1-10}$ ketone such as —COCH$_3$, —COC$_2$H$_5$, —COC$_3$H$_7$, —CO-phenyl, etc.; or a C$_{1-10}$ amine such as NH$_2$, NH(CH$_3$), N(CH$_3$)$_2$, N(CH$_3$)C$_2$H$_5$, etc. In some embodiments, ET may be

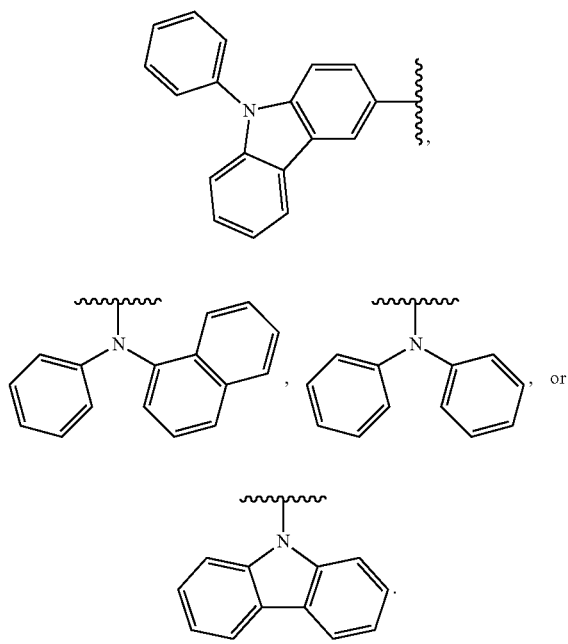

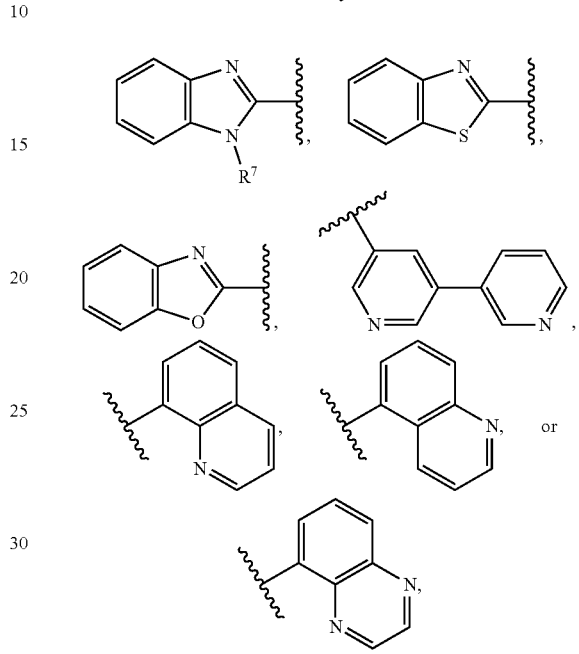

With respect to Formula 1, ET may be s optionally substituted benzimidazol-2-yl, optionally substituted benzothiazol-2-yl, optionally substituted benzoxazol-2-yl, optionally substituted 3,3'-bipyridin-5-yl, optionally substituted quinolin-8-yl, optionally substituted quinolin-5-yl, or optionally substituted quinoxalin-5-yl. If ET is substituted, it may have 1, 2, 3, or 4 substituents. Any substituent may be included on the ET. In some embodiments, some or all of the substituents on the ET may have: from 0 to 10 carbon atoms and from 0 to 10 heteroatoms, wherein each heteroatom is independently: O, N, S, F, Cl, Br, or I (provided that there is at least 1 non-hydrogen atom); and/or a molecular weight of 15 g/mol to 500 g/mol. For example, the substituents may be C$_{1-10}$ optionally substituted alkyl, such as CH$_3$, C$_2$H$_5$, C$_3$H$_7$, cyclic C$_3$H$_5$, C$_4$H$_9$, cyclic C$_4$H$_7$, C$_5$H$_{11}$, cyclic C$_5$H$_9$, In some embodiments, ET may be:

Some embodiments relate to compounds which may be:

-continued
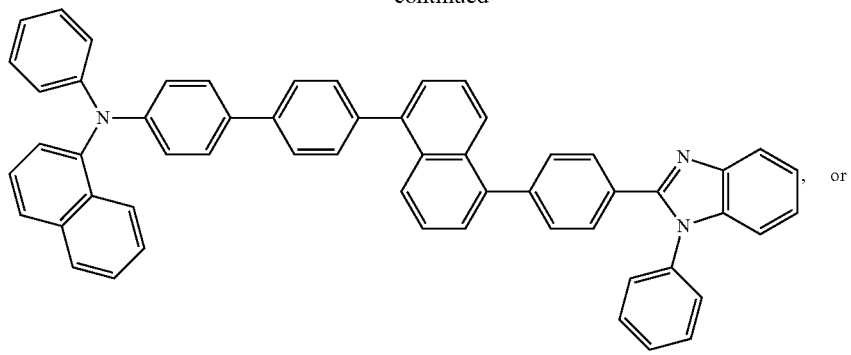
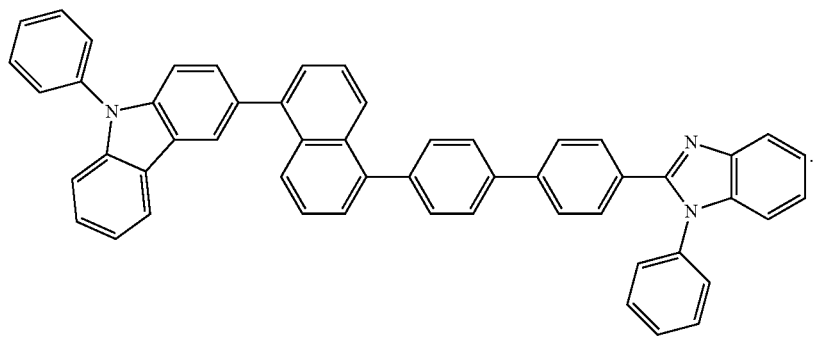
Some embodiments include an optionally substituted compound represented by one of the following formulas:
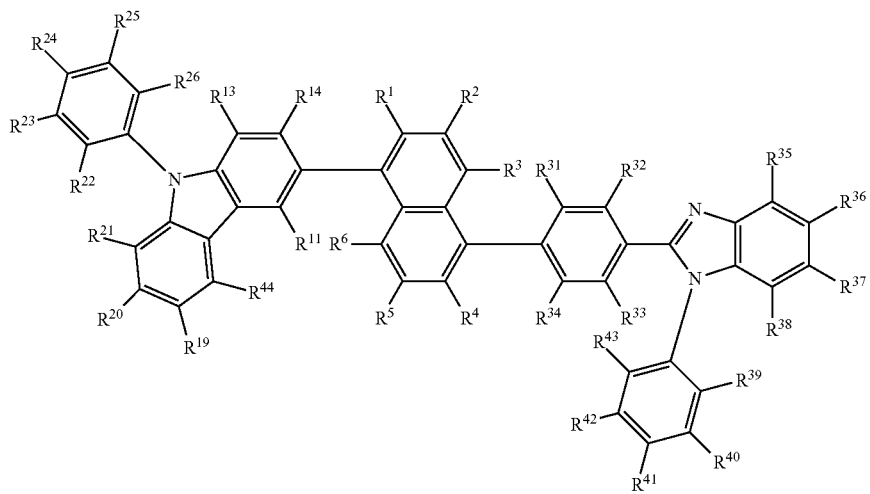
Formula 1A Formula 1B

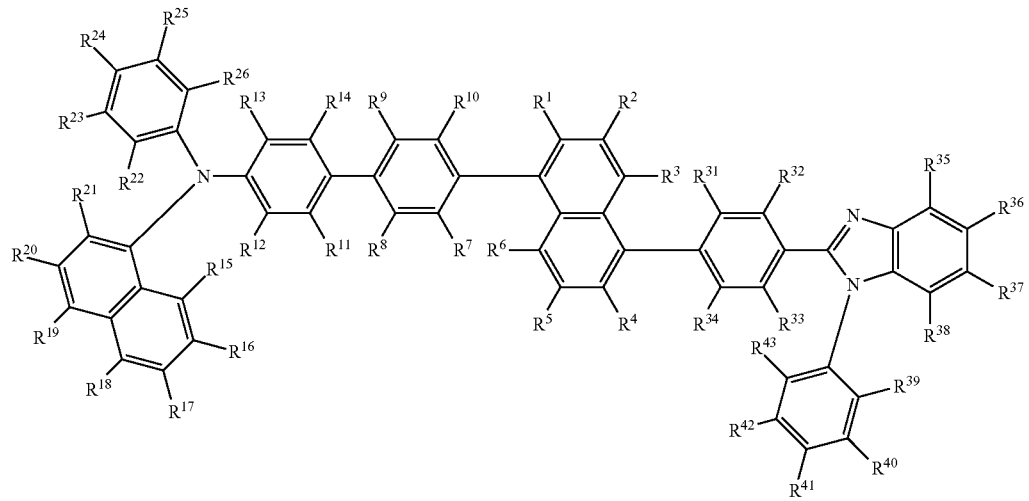

Formula 1C

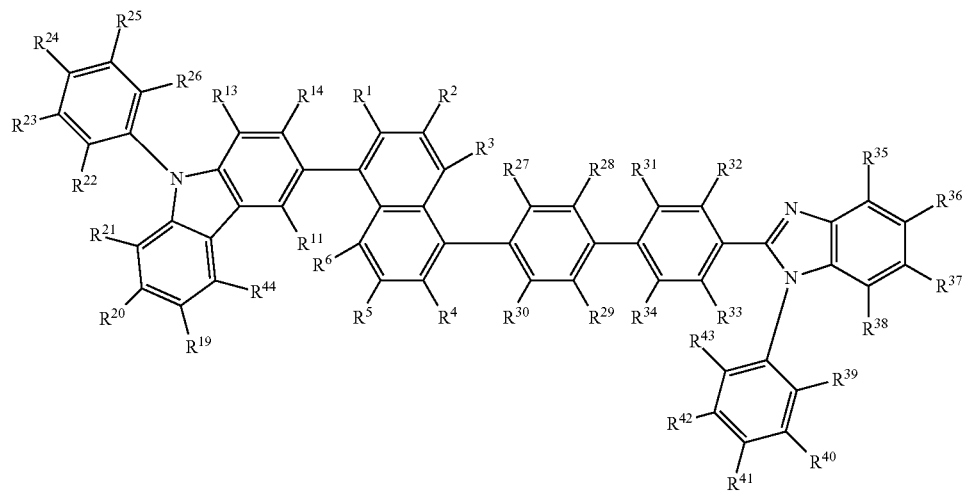

If stereochemistry is not indicated in any structural representation, such as a name or structural depiction, the structural representation includes any stereoisomer or any mixture of stereoisomers.

With respect to any relevant structural representation, such as Formulas 1, 1A, 1B, and 1C; $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, $R^{35}$, $R^{36}$, $R^{37}$, $R^{38}$, $R^{39}$, $R^{40}$, $R^{41}$, $R^{42}$, $R^{33}$, and $R^{44}$ may independently be H or any substituent, such as a substituent having from 0 to 6 carbon atoms and from 0 to 5 heteroatoms, wherein each heteroatom is independently: O, N, S, F, Cl, Br, or I; and/or having a molecular weight of 15 g/mol to 300 g/mol, or 15 g/mol to 150 g/mol. In some embodiments, are independently optionally substituted $C_{6-12}$ aryl, optionally substituted $C_{4-12}$ heteroaryl, 2-phenylethenyl, $R^A$, F, Cl, CN, $OR^A$, $CF_3$, $NO_2$, $NR^AR^B$, $COR^A$, $CO_2R^A$, $OCOR^A$, $NR^ACOR^B$, $CONR^AR^B$, etc. In some embodiments, are independently H; F; Cl; CN; $CF_3$; OH; $NH_2$; $C_{1-6}$ alkyl, such as methyl, ethyl, propyl isomers (e.g. n-propyl and isopropyl), cyclopropyl, butyl isomers, cyclobutyl isomers (e.g. cyclobutyl and methylcyclopropyl), pentyl isomers, cyclopentyl isomers, hexyl isomers, cyclohexyl isomers, etc.; or $C_{1-6}$ alkoxy, such as —O-methyl, —O-ethyl, isomers of —O-propyl, —O-cyclopropyl, isomers of —O-butyl, isomers of —O-cyclobutyl, isomers of —O-pentyl, isomers of —O-cyclopentyl, isomers of —O-hexyl, isomers of —O-cyclohexyl, etc.

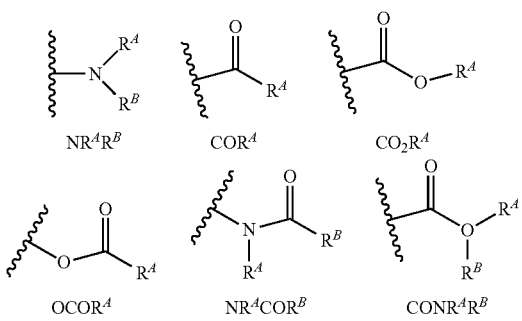

Each $R^A$ may independently be H, or $C_{1-12}$ alkyl, including: linear or branched alkyl having a formula $C_aH_{2a+1}$, or cycloalkyl having a formula $C_aH_{2a-1}$, wherein a is 1, 2, 3, 4, 5, 6, 7, 8, 9, 10, 11, or 12, such as linear or branched alkyl of a formula: $CH_3$, $C_2H_5$, $C_3H_7$, $C_4H_9$, $C_5H_{11}$, $C_6H_{13}$, $C_7H_{15}$, $C_8H_{17}$, $C_9H_{19}$, $C_{10}H_{21}$, etc., or cycloalkyl of a formula: $C_3H_5$, $C_4H_7$, $C_5H_9$, $C_6H_{11}$, $C_7H_{13}$, $C_8H_{15}$, $C_9H_{17}$, $C_{10}H_{19}$, etc. In some embodiments, $R^A$ may be H or $C_{1-6}$ alkyl. In some embodiments, $R^A$ may be H or $C_{1-3}$ alkyl. In some embodiments, $R^A$ may be H or $CH_3$. In some embodiments, $R^A$ may be H.

Each $R^B$ may independently be H, or $C_{1-12}$ alkyl, including: linear or branched alkyl having a formula $C_aH_{2a+1}$; or cycloalkyl having a formula $C_aH_{2a-1}$, wherein a is 1, 2, 3, 4, 5, 6, 7, 8, 9, 10, 11, or 12, such as linear or branched alkyl of a formula: $CH_3$, $C_2H_5$, $C_3H_7$, $C_4H_9$, $C_5H_{11}$, $C_6H_{13}$, $C_8H_{17}$, $C_7H_{15}$, $C_9H_{19}$, $C_{10}H_{21}$, etc., or cycloalkyl of a formula: $C_3H_5$, $C_4H_7$, $C_5H_9$, $C_6H_{11}$, $C_7H_{13}$, $C_8H_{15}$, $C_9H_{17}$, $C_{10}H_{19}$, etc. In some embodiments, $R^B$ may be H or $C_{1-3}$ alkyl. In some embodiments, $R^B$ may be H or $CH_3$. In some embodiments, $R^B$ can be H.

With respect to any relevant structural representation, such as Formulas 1, 1A, 1B, and 1C; $R^1$ can be H, or any substituent, such as a substituent having a molecular weight of 15 mol/g to 200 mol/g. In some embodiments, $R^1$ is $NO_2$, ON, H, F, Cl, Br, I, —$CO_2H$, —OH, $C_{1-6}$ alkylamino, $C_{1-6}$ alkyl, or $C_{1-6}$—O-alkyl. In some embodiments, $R^1$ is H. Additionally, for any embodiments above in this paragraph, the remaining groups of $R^1$ to $R^{44}$ can independently be: $R^A$, F, Cl, ON, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, ON, $CF_3$, OH, $NH_2$, $C_{1-6}$ alkyl, or $C_{1-6}$ alkoxy.

With respect to any relevant structural representation, such as Formulas 1, 1A, 1B, and 1C; $R^2$ can be H, or any substituent, such as a substituent having a molecular weight of 15 mol/g to 200 mol/g. In some embodiments, $R^2$ is $NO_2$, ON, H, F, Cl, Br, I, —$CO_2H$, —OH, $C_{1-6}$ alkylamino, $C_{1-6}$ alkyl, or $C_{1-6}$—O-alkyl. In some embodiments, $R^2$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, ON, $CF_3$, OH, $NH_2$, $C_{1-6}$ alkyl, or $C_{1-6}$ alkoxy.

With respect to any relevant structural representation, such as Formulas 1, 1A, 1B, and 1C; $R^3$ can be H, or any substituent, such as a substituent having a molecular weight of 15 mol/g to 200 mol/g. In some embodiments, $R^3$ is $NO_2$, CN, H, F, Cl, Br, I, —$CO_2H$, —OH, $C_{1-6}$ alkylamino, $C_{1-6}$ alkyl, or $C_{1-6}$—O-alkyl. In some embodiments, $R^3$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1, 1A, 1B, and 1C; $R^4$ can be H, or any substituent, such as a substituent having a molecular weight of 15 mol/g to 200 mol/g. In some embodiments, $R^4$ is $NO_2$, CN, H, F, Cl, Br, I, —$CO_2H$, —OH, $C_{1-6}$ alkylamino, $C_{1-6}$ alkyl, or $C_{1-6}$—O-alkyl. In some embodiments, $R^4$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1, 1A, 1B, and 1C; $R^5$ can be H, or any substituent, such as a substituent having a molecular weight of 15 mol/g to 200 mol/g. In some embodiments, $R^5$ is $NO_2$, CN, H, F, Cl, Br, I, —$CO_2H$, —OH, $C_{1-6}$ alkylamino, $C_{1-6}$ alkyl, or $C_{1-6}$—O-alkyl. In some embodiments, $R^5$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1, 1A, 1B, and 1C; $R^6$ can be H, or any substituent, such as a substituent having a molecular weight of 15 mol/g to 200 mol/g. In some embodiments, $R^6$ is $NO_2$, CN, H, F, Cl, Br, I, —$CO_2H$, —OH, $C_{1-6}$ alkylamino, $C_{1-6}$ alkyl, or $C_{1-6}$—O-alkyl. In some embodiments, $R^6$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^7$ can be H, or any substituent, such as a substituent having a molecular weight of 15 mol/g to 200 mol/g. In some embodiments, $R^7$ is $NO_2$, CN, H, F, Cl, Br, I, —$CO_2H$, —OH, $C_{1-6}$ alkylamino, $C_{1-6}$ alkyl, or $C_{1-6}$—O-alkyl. In some embodiments, $R^7$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^8$ can be H, or any substituent, such as a substituent having a molecular weight of 15 mol/g to 200 mol/g. In some embodiments, $R^8$ is $NO_2$, CN, H, F, Cl, Br, I, —$CO_2H$, —OH, $C_{1-6}$ alkylamino, $C_{1-6}$ alkyl, or $C_{1-6}$—O-alkyl. In some embodiments, $R^8$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^9$ can be H, or any substituent, such as a substituent having a molecular weight of 15 mol/g to 200 mol/g. In some embodiments, $R^9$ is $NO_2$, CN, H, F, Cl, Br, I, —$CO_2H$, —OH, $C_{1-6}$ alkylamino, $C_{1-6}$ alkyl, or $C_{1-6}$—O-alkyl. In some embodiments, $R^9$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{10}$ can be H, or any substituent, such as a substituent having a molecular weight of 15 mol/g to 200 mol/g. In some embodiments, $R^{10}$ is $NO_2$, CN, H, F, Cl, Br, I, —$CO_2H$, —OH, $C_{1-6}$ alkylamino, $C_{1-6}$ alkyl, or $C_{1-6}$—O-alkyl. In some embodiments, $R^{10}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{11}$ can be H, or any substituent, such as a substituent having a molecular weight of 15 mol/g to 200 mol/g. In some embodiments, $R^{11}$ is $NO_2$, CN, H, F, Cl, Br, I, —$CO_2H$, —OH, $C_{1-6}$ alkylamino, $C_{1-6}$ alkyl, or $C_{1-6}$—O-alkyl. In some embodiments, $R^{11}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{12}$ can be H, or any substituent, such as a substituent having a molecular weight of 15 mol/g to 200 mol/g. In some embodiments, $R^{12}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{12}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{13}$ can be H, or any substituent, such as a substituent having a molecular weight of 15 mol/g to 200 mol/g. In some embodiments, $R^{13}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{13}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{14}$ can be H, or any substituent, such as a substituent having a molecular weight of 15 mol/g to 200 mol/g. In some embodiments, $R^{14}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{14}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{15}$ can be H, or any substituent, such as a substituent having a molecular weight of 15 mol/g to 200 mol/g. In some embodiments, $R^{15}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{15}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{16}$ can be H, or any substituent, such as a substituent having a molecular weight of 15 mol/g to 200 mol/g. In some embodiments, $R^{16}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{16}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{17}$ can be H, or any substituent, such as a substituent having a molecular weight of 15 mol/g to 200 mol/g. In some embodiments, $R^{17}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{17}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$,
$OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{18}$ can be H, or any substituent, such as a substituent having a molecular weight of 15 mol/g to 200 mol/g. In some embodiments, $R^{18}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{18}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{19}$ can be H, or any substituent, such as a substituent having a molecular weight of 15 mol/g to 200 mol/g. In some embodiments, $R^{19}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{19}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{20}$ can be H, or any substituent, such as a substituent having a molecular weight of 15 mol/g to 200 mol/g. In some embodiments, $R^{20}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{20}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{21}$ can be H, or any substituent, such as a substituent having a molecular weight of 15 mol/g to 200 mol/g. In some embodiments, $R^{21}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{21}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{22}$ can be H, or any substituent, such as a substituent having a molecular weight of 15 mol/g to 200 mol/g. In some embodiments, $R^{22}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{22}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, $OCOR^A$, $NR^ACOR^B$, or $CONR^AR^B$; or H, F, Cl, CN, $CF_3$, OH, $NH_2$, $C_{1-6}$ alkyl, or $C_{1-6}$ alkoxy.

With respect to any relevant structural representation, such as Formulas 1A, 1B, and 1C; $R^{23}$ can be H, or any substituent, such as a substituent having a molecular weight of 15 mol/g to 200 mol/g. In some embodiments, $R^{23}$ is $NO_2$, CN, H, F, Cl, Br, I, $—CO_2H$, $—OH$, $C_{1-6}$ alkylamino, $C_{1-6}$ alkyl, or $C_{1-6}$—O-alkyl. In some embodiments, $R^{23}$ is H. Additionally, for any embodiments above in this paragraph, the remaining groups of $R^1$ to $R^{44}$ can independently be: $R^A$, F, Cl, CN, $OR^A$, $CF_3$, $NO_2$, $NR^AR^B$, $COR^A$, $CO_2R^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{24}$ can be H, or any substituent, such as a substituent having a molecular weight of 15 mol/g to 200 mol/g. In some embodiments, R$^{24}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{24}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{25}$ can be H, or any substituent, such as a substituent having a molecular weight of 15 mol/g to 200 mol/g. In some embodiments, R$^{25}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{25}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{26}$ can be H, or any substituent, such as a substituent having a molecular weight of 15 mol/g to 200 mol/g. In some embodiments, R$^{26}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{26}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{27}$ can be H, or any substituent, such as a substituent having a molecular weight of 15 mol/g to 200 mol/g. In some embodiments, R$^{27}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{27}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{28}$ can be H, or any substituent, such as a substituent having a molecular weight of 15 mol/g to 200 mol/g. In some embodiments, R$^{28}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{28}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{29}$ can be H, or any substituent, such as a substituent having a molecular weight of 15 mol/g to 200 mol/g. In some embodiments, R$^{29}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{29}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{30}$ can be H, or any substituent, such as a substituent having a molecular weight of 15 mol/g to 200 mol/g. In some embodiments, R$^{30}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{30}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{31}$ can be H, or any substituent, such as a substituent having a molecular weight of 15 mol/g to 200 mol/g. In some embodiments, R$^{31}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{31}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{32}$ can be H, or any substituent, such as a substituent having a molecular weight of 15 mol/g to 200 mol/g. In some embodiments, R$^{32}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{32}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{33}$ can be H, or any substituent, such as a substituent having a molecular weight of 15 mol/g to 200 mol/g. In some embodiments, R$^{33}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{33}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{34}$ can be H, or any substituent, such as a substituent having a molecular weight of 15 mol/g to 200 mol/g. In some embodiments, R$^{34}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{34}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{35}$ can be H, or any substituent, such as a substituent having a molecular weight of 15 mol/g to 200 mol/g. In some embodiments, R$^{35}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{35}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{36}$ can be H, or any substituent, such as a substituent having a molecular weight of 15 mol/g to 200 mol/g. In some embodiments, R$^{36}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{36}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{37}$ can be H, or any substituent, such as a substituent having a molecular weight of 15 mol/g to 200 mol/g. In some embodiments, R$^{37}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{37}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{38}$ can be H, or any substituent, such as a substituent having a molecular weight of 15 mol/g to 200 mol/g. In some embodiments, R$^{38}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{38}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{39}$ can be H, or any substituent, such as a substituent having a molecular weight of 15 mol/g to 200 mol/g. In some embodiments, R$^{39}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{39}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{40}$ can be H, or any substituent, such as a substituent having a molecular weight of 15 mol/g to 200 mol/g. In some embodiments, R$^{40}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{40}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{41}$ can be H, or any substituent, such as a substituent having a molecular weight of 15 mol/g to 200 mol/g. In some embodiments, R$^{41}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{41}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{42}$ can be H, or any substituent, such as a substituent having a molecular weight of 15 mol/g to 200 mol/g. In some embodiments, R$^{42}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{42}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{43}$ can be H, or any substituent, such as a substituent having a molecular weight of 15 mol/g to 200 mol/g. In some embodiments, R$^{43}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{43}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

With respect to any relevant structural representation, such as Formulas 1A, 1B, and 1C; R$^{44}$ can be H, or any substituent, such as a substituent having a molecular weight of 15 mol/g to 200 mol/g. In some embodiments, R$^{44}$ is NO$_2$, CN, H, F, Cl, Br, I, —CO$_2$H, —OH, C$_{1-6}$ alkylamino, C$_{1-6}$ alkyl, or C$_{1-6}$—O-alkyl. In some embodiments, R$^{44}$ is H. Additionally, for any embodiments above in this paragraph, the remaining groups of R$^1$ to R$^{44}$ can independently be: R$^A$, F, Cl, CN, OR$^A$, CF$_3$, NO$_2$, NR$^A$R$^B$, COR$^A$, CO$_2$R$^A$, OCOR$^A$, NR$^A$COR$^B$, or CONR$^A$R$^B$; or H, F, Cl, CN, CF$_3$, OH, NH$_2$, C$_{1-6}$ alkyl, or C$_{1-6}$ alkoxy.

Some embodiments include a light emissive element comprising at least one of the aforementioned compounds.

Some embodiments include an organic light emitting diode device, further comprising a cathode, an anode, and a light-emissive layer disposed between and electrically connected to the anode and the cathode, wherein the light-emitting layer comprises a host compound selected from the aforementioned compounds.

In some embodiments, a light-emitting device is described comprising a compound described above. In some embodiments, the light-emitting device can be described as comprising the compound as a host in an emissive layer.

Some embodiments include a hole-transport layer between the anode and the light-emitting layer and an electron-transport layer between the cathode and the light emitting layer.

Some embodiments include a device wherein the light-emitting layer, and the hole-transport layer, and the electron transport layer comprise a host compound selected from the aforementioned compounds.

Some embodiments include the aforementioned device wherein R$^1$, R$^2$, R$^3$, R$^4$, R$^5$, and R$^6$ are H, and ET is an optionally substituted benzimidazol-2-yl, and HT is selected from optionally substituted phenylnapthylamine and optionally substituted carbazolyl.

Some embodiments include the aforementioned device wherein the light-emissive layer further comprises an emissive component.

Some embodiments include the aforementioned device wherein the emissive component comprises phosphorescent material.

In some embodiments, the compounds described may be used as an emissive compound, as an ambipolar host in an organic light-emitting diode emissive layer, or both. In some embodiments, the compounds described may be used in emissive elements of organic light emitting diode (OLED) devices. In some embodiments, the compounds disclosed herein may provide well balanced hole-transport and electron-transport mobility, which may lead to a simpler device structure with high quantum efficiency and low turn-on voltage. For example in some embodiments, the organic light-emitting diode or device incorporating the presently described compounds may not have a hole-transporting layer or an emissive layer. In some embodiments, these compounds may have high electrochemical stability, high thermal stability, a high glass transition temperature (Tg), and high photo-stability. Thus, these compounds may provide an OLED device with a longer lifetime than existing OLED devices.

The compounds and compositions described herein can be incorporated into light-emitting devices in various ways. For example, an embodiment provides a light-emitting device comprising: an anode layer made up of a high work function metal, a cathode layer made up of a low work function metal, and a light-emitting layer positioned between the anode layer and cathode layer. The light-emitting device may be configured so that the anode can transfer holes to the light-emitting layer and the cathode can transfer electrons to the light-emitting layer. The light-emitting layer contains the compounds and/or compositions disclosed herein.

An anode layer may comprise conventional material such as a metal, mixed metal, alloy, metal oxide or mixed metal oxide, or a conductive polymer. Examples of suitable metals include the metals in Groups 10, 11, and 12 transition metals. If the anode layer is to be light-transmitting, mixed-metal oxides of Groups 12, 13 and 14 metals or alloys thereof, such as zinc oxide, tin oxide, indium zinc oxide or indium-tin-oxide may be used. The anode layer ay include an organic material such as polyaniline, e.g., as described in "Flexible light-emitting diodes made from soluble conducting polymer," Nature, vol. 357, pp. 477-479 (11 Jun. 1992). Examples of suitable high work function metals include but are not limited to Au, Pt, indium-tin-oxide (ITO), or alloys thereof. In some embodiments, the anode layer can have thickness in the range of about 1 nm to about 1000 nm.

A cathode layer may include a material having a lower work function than the anode layer. Examples of suitable materials for the cathode layer include those selected from alkali metals of Group 1, 2, 11, 12, and 13 metals including rare earth elements, lanthanides and actinides, materials such as aluminum, indium, calcium, barium, samarium, and magnesium, and combinations thereof. Li-containing organo-metallic compounds, LiF, and $Li_2O$ may also be deposited between the organic layer and the cathode layer to lower the operating voltage. Suitable low function metals include but are not limited to Al, Ag, Mg, Ca, Cu, Mg/Ag, LiF/Al, CsF, CsF/Al or alloys thereof. In some embodiments, the cathode layer can have thickness in the range of about 1 nm to about 1000 nm.

The amount of the compounds disclosed herein in the light-emitting composition can vary. In the described embodiment the compound disclosed herein is approximately 90% by weight of the light-emitting layer. However, the amount of the compound disclosed herein in the light-emitting layer may be in the range of from about 1% to 100% by weight of the light-emitting layer. In some embodiments, the mass of the electroluminescent compound may be about 0.1% to about 10%, about 1% to about 5%, or about 3% of the mass of the light-emitting layer.

The light-emitting component or compound may be chosen to vary the color of the light emitted by the light-emitting device. For example, a blue light-emitting component may emit a combination of visible photons so that the light appears to have a blue quality to an observer. In some embodiments, a blue light-emitting component may emit visible photons having an average wavelength in the range of about 440 nm or about 460 nm to about 490 nm or about 500 nm. The "average wavelength" of visible photons may include, when referring to the visible emission spectrum of a compound, the wavelength wherein the area under the curve for the part of the visible spectrum having a lower wavelength than the average wavelength is about equal to the area under the curve for the part of the visible spectrum having a higher wavelength than the average wavelength.

In some embodiments, the organic component may comprise at least one light-emitting layer comprising a light-emitting component, and optionally, a host. A host may comprise a compound described herein, a hole-transport material, an electron-transport material, and/or an ambipolar material. In some embodiments, the device may be configured so that holes can be transferred from the anode to the light-emitting layer. In some embodiments, the device may be configured so that electrons can be transferred from the cathode to the light-emitting layer. If present, the amount of the host in a light-emitting layer can vary. In one embodiment, the amount of a host in a light-emitting layer may be in the range of from about 1% to about 99.9% by weight of the light-emitting layer. In another embodiment, the amount of a host in a light-emitting layer may be in the range of from about 90% to about 99% by weight of the light-emitting layer. In another embodiment, the amount of a host in a light-emitting layer may be about 97% by weight of the light-emitting layer.

The thickness of the light-emitting layer may vary. In one embodiment, the light-emitting layer thickness is about 30 nm. However, this is not intended to be limiting, the light-emitting layer can have a thickness in the range of about 5 nm to 200 nm.

The compounds and compositions described herein may be useful in an emissive layer without requiring any additional hole-transport or electron-transport materials. Thus, in some embodiments, the light-emitting layer consists essentially of an electroluminescent compound and a compound disclosed herein. In some embodiments, the light-emitting layer may comprise at least one hole-transport material or electron-transport material in addition to a compound disclosed herein.

In some embodiments, a hole-transport material may comprise at least one of an aromatic-substituted amine, a carbazole, a polyvinylcarbozole (PVK), e.g. poly(9-vinylcarbozole); N,N'-bis(3-methylphenyl)N,N'-diphenyl-[1,1'-biphenyl]-4,4'-diamine (TPD); polyfluorene; a polyfluorene copolymer; poly(9,9-di-n-octylfluorene-alt-benzothiadiazole); poly(paraphenylene); poly[2-(5-cyano-5-methylhexyloxy)-1,4-phenylene]; 1,1-Bis(4-bis(4-methylphenyl) aminophenyl)cyclohexane; 2,9-Dimethyl-4,7-diphenyl-1, 10-phenanthroline; 3,5-Bis(4-tert,butyl-phenyl)-4-phenyl[1, 2,4]triazole; 3,4,5-Triphenyl-1,2,3-triazole; 4,4',4"-Tris(N-naphthylen-2-yl)-N-phenylamino)triphyenylamine (MTDATA); 4,4'-bis[N-(naphthyl-N-phenyl-amino]biphenyl (NPB); 4,4'-bis[N,N'-(3-tolyl)amino]-3,3'-dimethylbiphenyl (HMTPD); 4,4'-N'-dicarbazolebiphenyl (CBP); 1,3-N,N-dicarbazole-benzene (mCP); poly(9-vinylcarbazole) (PVK); a benzidine; a phenylenediamine; a phyhalocyanine metal complex; a polyacetylene; a polythiophene; a triphenylamine an oxadiazole; copper phthalocyanine; N,N',N"-1,3,5-tricarbazoloylbenzene (tCP); N,N'-bis(4-butylphenyl)-N,N'-bis(phenyl)benzidine; and the like.

In some embodiments, an electron-transport material may comprise at least one of 2-(4-biphenylyl)-5-(4-tert-butylphenyl)-1,3,4,oxadiazole (PBD); 1,3-bis(N,N-t-butylphenyl)-1,3,4-oxadiazole (OXD-7); 1,3-bis[2-(2,2'-bipyridine-6-yl)-1,3,4-oxadiazo-5-yl]benzene; 3-phenyl-4-(1'-naphthyl)-5-phenyl-1,2,4-triazole (TAZ); 2,9-dimethyl-4,7-diphenyl-phenanthroline (bathocuproine or BCP); aluminum tris(8-hydroxyquinolate) (Alq$_3$); and 1,3,5-tris(2-N-phenylbenzimidiazolyl)benzene; 1,3-bis[2-(2,2'-bipyridine-6-yl)-1,3,4-oxadiazo-5-yl]benzene (BPY-OXD); 3-phenyl-4-(1'naphthyl)-5-phenyl-1,2,4-triazole (TAZ); and 1,3,5-tris[2-N-phenylbenzimidazol-z-yl]benzene (TPBI). In one embodiment the electron transport layer may be aluminum quinolate (Alq$_3$), PBD, phenanthroline, quinoxaline, TPBI, or a derivative or a combination thereof.

In some embodiments, the device comprises no electron-transport or hole-transport layer. In some embodiments, the device consists essentially of the anode layer, the cathode layer, and the light-emitting layer. In other embodiments, the light-emitting device may further comprise a hole-transport layer disposed between the anode and the light-emitting layer. The hole-transport layer may comprise at least one hole-transport material. Suitable hole-transport materials may include those listed above in addition to any others known to those skilled in the art.

In some embodiments, the light-emitting device may further comprise an electron-transport layer disposed between the cathode and the light-emitting layer. The electron-transport layer may comprise at least one electron-transport material. Suitable electron-transport materials include those listed above as well as any others known to those skilled in the art.

If desired, additional layers may be included in the light-emitting device. These additional layers may be an electron injection layer (EIL), a hole blocking layer (HBL), an exciton blocking layer (EBL), and/or a hole injection layer (HIL). In addition to separate layers, some of these materials may be combined into a single layer.

In some embodiments, the light-emitting device can include an electron injection layer between the cathode layer and the light-emitting layer. A number of suitable electron injection materials are known to those skilled in the art. Examples of suitable material(s) that can be included in the electron injection layer include but are not limited to, an optionally substituted compound selected from the following: Alq$_3$; PBD; phenanthroline; quinoxaline; TPBI a triazine; a metal chelate of 9-hydroxyquinoline such as tris(8-hydroxyqunioliate) aluminum; and a metal thioxinoid compound such as bis(8-quinolinethiolato) zinc. In one embodiment, the electron injection layer may be a derivative or combination of the above listed materials.

In some embodiments, the device can include a hole-blocking layer, e.g., between the cathode and the light-emitting layer. Various suitable hole-blocking materials than can be included in the hole-blocking layer are known to those skilled in the art. Suitable hole-blocking material(s) include but are not limited to, an optionally substituted compound selected from the following: BCP; 3,4,5,triphenyl-1,2,4-triazole; 3,5-bis(4-tert-butyl-phenyl)-4-phenyl-[1,2,4]triazole; 2,9-dimethyl-4,7-diphenly-1,10-phenanthroline; and 1,1-bis(4-bis(methylphenyl)aminophenyl)-cyclohexane.

In some embodiments, the light-emitting device can include an exciton blocking layer, e.g., between the light-emitting layer and the anode. In an embodiment, the band gap of the material(s) that comprise an exciton blocking layer may be large enough to substantially prevent the diffusion of excitons. A number of suitable exciton blocking materials that can be included in an exciton blocking layer are known to those skilled in the art. Examples of material(s) that can compose an exciton blocking layer include an optionally substituted compound selected from the following: Alq$_3$; PB; CBP; BCP; and any other materials that have a large enough band gap to substantially prevent the diffusion of excitons.

In some embodiments, the light-emitting device can include a hole-injection layer, e.g., between the light-emitting layer and the anode. Various suitable hole-injection materials that can be included in the hole-injection layer are known to those skilled in the art. Exemplary hole-injection material(s) may include an optionally substituted compound selected from the following: a polythiopene derivative such as poly(3,4-ethyenedioxythiophene) (PEDOT)/polystyrene (PSS); a benzidine derivative such as N,N,N',N'-tetraphenylbenzidine; poly(N,N'-bis(4-butylphenyl)-N,N'-bis(phenyl)benzidine); a tripenylamine or phenylenediamine derivative such as N,N'-bis(4-methylphenyl)-N,N'-bis(phenyl)-1,4-phenylenediamine, 4,4',4"tris(naphthylen-2-yl)-N-phenylamino)triphenylamine; an oxadiazole derivative such as 1,3-bis(5-(4-diphenylamino)phenyl-1,3,4-oxadiazol-2-yl) benzene; a polyacetylene derivative such as poly(1,2-bis-benzylthio-acetylene); and a phthalocyanine metal complex derivative such as phthalocyamine copper. Hole-injection materials, while still being able to transport holes, may have a hole mobility substantially less than the hole mobility of conventional hole-transport materials.

The emissive compositions may be prepared by adapting methods known in the art for other emissive compositions. For example, the emissive compositions may be prepared by dissolving or dispersing the electroluminescent compound (including any compound described herein) and any host (including any compound described herein), if present, in a solvent and depositing the composition on the appropriate layer of the device. The liquid may be a single phase, or may comprise one or more additional solid or liquid phases dispersed in it. The solvent may then be allowed to evaporate, or the solvent may be removed via heat or vacuum, to provide an emissive composition. Alternatively, an electroluminescent compound may be melted, or added to a molten or liquid host material (if present). The molten composition may then be applied as a layer into the device, and allowed to solidify to provide a viscous liquid or solid emissive composition layer.

Light-emitting devices comprising the compounds disclosed herein can be fabricated using techniques known in the art, as informed by guidance provided herein. For example, a glass substrate can be coated with a high work functioning metal such as ITO which can act as an anode. After patterning the anode layer, a light-emitting layer that includes at least a compound disclosed herein, and optional electroluminescent compound, can be deposited on the anode. The cathode layer, comprising a low work functioning metal, can then be deposited, e.g., vapor evaporated, onto the light-emitting layer. If desired, the device can also include an electron transport/injection layer, a hole blocking layer, a hole injection layer, an exciton blocking layer and/or a second light-emitting layer that can be added to the device using techniques known in the art, as informed by the guidance provided herein.

An example of a configuration of a device comprising a compound as described herein is shown in FIG. 1. The device comprises the following layers in the order given: An ITO anode 10; a PEDOT:PSS hole-injection layer 15; NPB hole-transport layer 20; an light-emitting layer comprising an electroluminescent compound and one of the host compounds described herein 25; a TPBI electron-transport layer 30; an Al/LiF cathode 35; and a glass cap 40.

In some embodiments, the OLED may be configured by a wet process such as a process that comprises at least one of spraying, spin coating, drop casting, inkjet printing, screen printing, etc. Some embodiments provide a composition which may be a liquid suitable deposition onto a substrate. The liquid may be a single phase, or may comprise one or more additional solid or liquid phases dispersed in it. The liquid typically comprises a light-emitting compound, a host material disclosed herein, and a solvent.

The following non-limiting embodiments are contemplated:

Embodiment 1

A host compound for use in emissive elements of organic light emitting devices, the compound being represented by Formula 1:

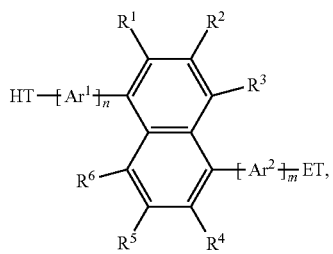

wherein $R^1$, $R^2$, $R^3$, $R^4$, $R^5$, and $R^6$ are independently H, $C_1$-$C_3$ alkyl, or $C_{1-3}$ perfluoroalkyl;
wherein $Ar^1$ and $Ar^2$ are independently optionally substituted 1,4-interphenylene or 1,3-interphenylene, wherein n is 0, 1, or 2; and m is 0, 1, or 2;
HT is optionally substituted carbazolyl, optionally substituted 9-phenylcarbazolyl, optionally substituted phenylnaphthylamine, or optionally substituted diphenylamine; and
ET is optionally substituted benzimidazol-2-yl, optionally substituted benzothiazol-2-yl, optionally substituted benzoxazol-2-yl, optionally substituted 3,3'-bipyridin-5-yl, optionally substituted quinolin-8-yl, optionally substituted quinolin-5-yl, or optionally substituted quinoxalin-5-yl.

Embodiment 2

The compound of embodiment 1, wherein $R^1$, $R^2$, $R^3$, $R^4$, $R^5$ and $R^6$ are H.

Embodiment 3

The compound of embodiment 1, wherein HT is

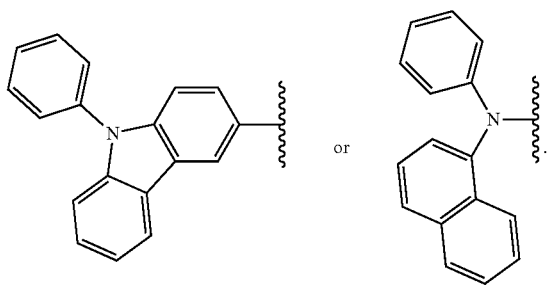 [SMILES: *c1ccc2c(c1)c1ccccc1n2-c1ccccc1 ; *N(c1ccccc1)c1cccc2ccccc12]

Embodiment 4

The compound of embodiment 1, wherein ET is

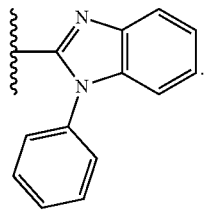 [SMILES: *c1nc2ccccc2n1-c1ccccc1]

Embodiment 5

The compound of embodiment 1, wherein the compound is:

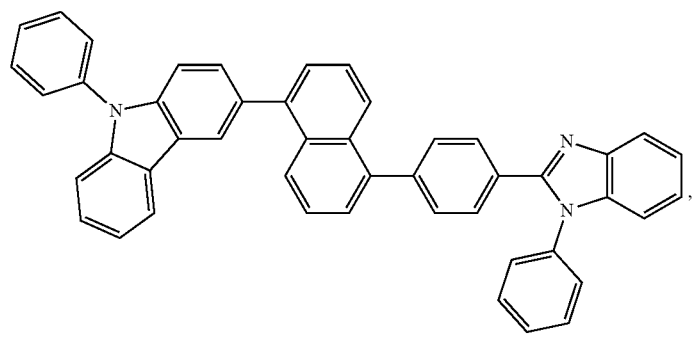

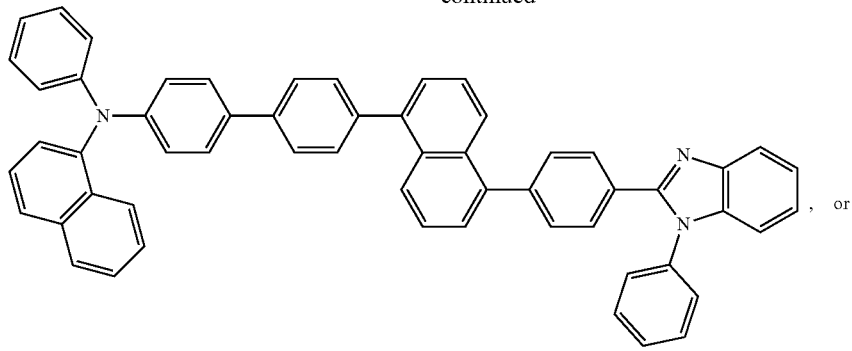

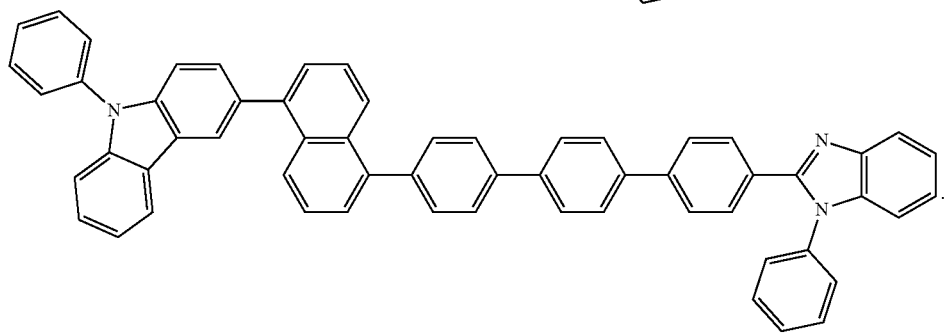

Embodiment 6

A light emitting emissive element comprising a compound from embodiments 1-5.

Embodiment 7

An organic light-emitting diode device comprising:
a cathode;
an anode; and
a light-emitting layer disposed between and electrically connected to the anode and the cathode, wherein the light-emitting layer comprises a host compound according to embodiment 1.

Embodiment 8

The device of embodiment 7, further comprising a hole-transport layer between the anode and the light-emitting layer and an electron-transport layer between the cathode and the light-emitting layer.

Embodiment 9

The device of embodiment 8, wherein all of the light-emitting layer, the hole-transport layer and the electron-transport layer comprise the host compound according to embodiment 1.

Embodiment 10

The device of Embodiment 7, wherein $R^1$, $R^2$, $R^3$, $R^4$, $R^5$, and $R^6$ are H, and ET is an optionally substituted benzimidazol-2-yl and HT is optionally substituted phenylnapthylamine or optionally substituted carbazolyl.

Embodiment 11

The device of Embodiment 7, wherein the light-emissive layer further comprises an emissive component.

Embodiment 12

The device of Embodiment 11, wherein the emissive component comprises a phosphorescent material.

The following are examples of some methods that may be used to prepare compounds and devices as described herein. Each compound of note is labeled in bold on each of the figures presented. For example, compound 1 is labeled 1 on the figure, compound 2 is labeled 2, etc. In addition, the synthesis of said compound is described in the examples below.

Example 1

Organic Synthesis

Example 1.1

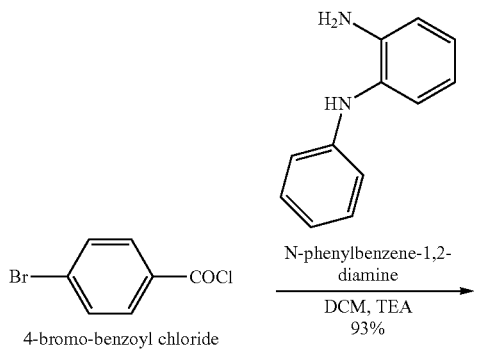

-continued

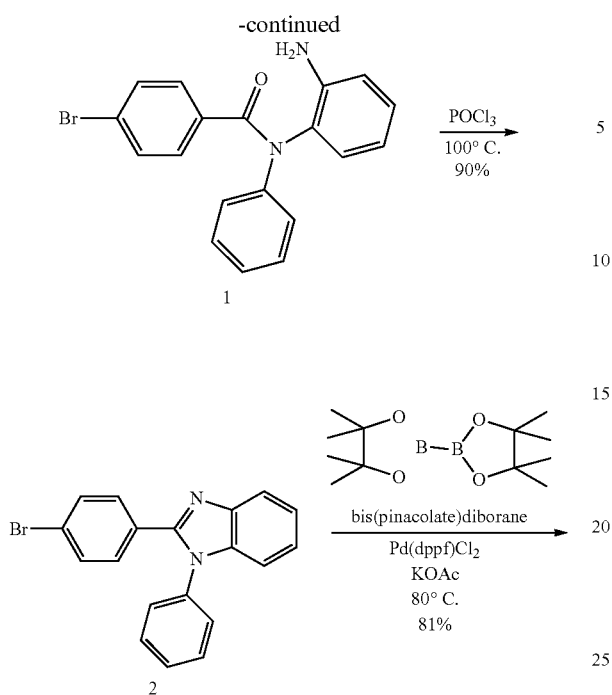

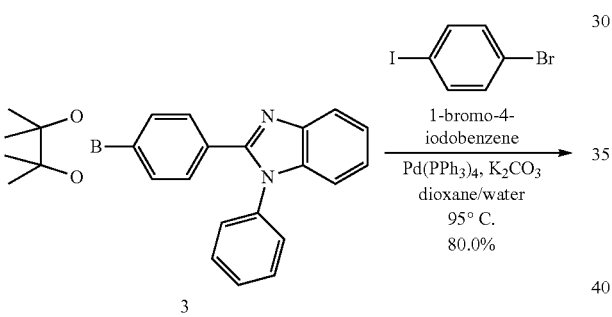

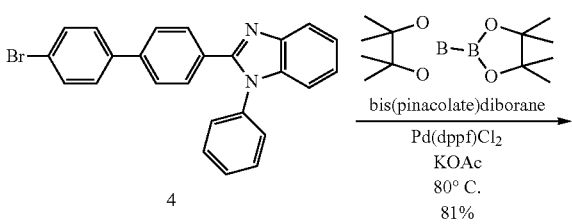

Example 1.1.1

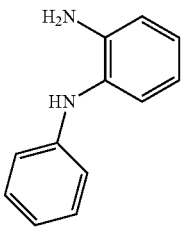

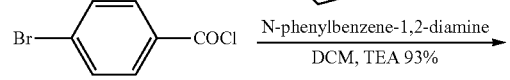
4-bromo-benzoyl chloride

N-phenylbenzene-1,2-diamine
DCM, TEA 93%

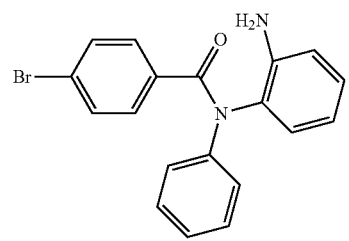

4-Bromo-N-(2-(phenylamino)phenyl)benzamide
(Compound 1)

To a solution of 4-bromo-benzoyl chloride (11 g, 50 mmol) in anhydrous dichloromethane (DCM) (100 ml), was added N-phenylbenzene-1,2-diamine (10.2 g, 55 mmol), then triethylamine (TEA) (17 ml, 122 mmol) slowly. The whole was stirred at room temperature (RT) overnight. Filtration gave a white solid 1 (6.5 g). The filtrate was worked up with water (300 ml), then extracted with DCM (300 ml) three times. The organic phase was collected and dried over MgSO$_4$, concentrated and recrystallized in DCM/hexanes to give another portion of white solid 1 (10.6 g). Total amount of product 1 is 17.1 g, in 93% yield.

Example 1.1.2

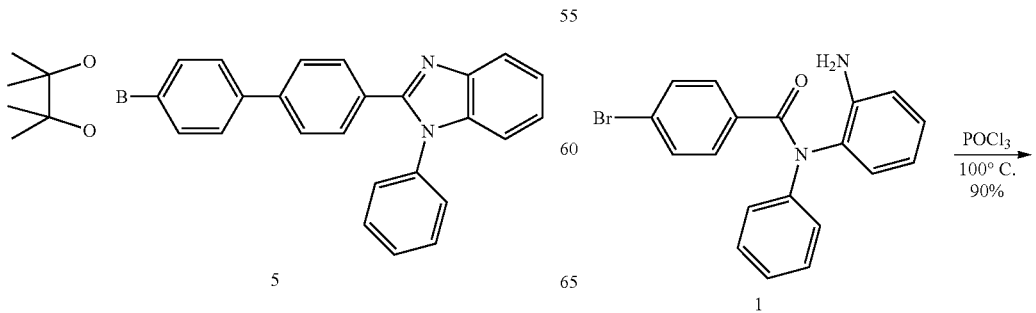

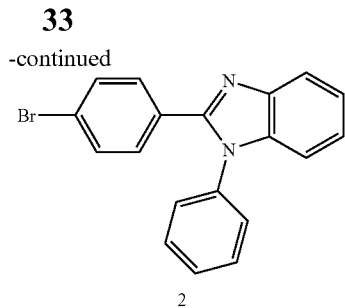

2-(4-bromophenyl)-1-phenyl-1H-benzo[d]imidazole (Compound 2)

To a suspension of amide 1 (9.6 g, 26 mmol) in anhydrous 1,4-dioxane (100 mL) was added phosphorus oxychloride (POCl$_3$) (9.2 mL, 100 mmol) slowly. The whole was then heated at about 100° C. overnight. After cooling to RT, the mixture was poured into ice (200 g) with stirring. Filtration, followed by recrystallization in DCM/hexanes gave a pale grey solid 2 (8.2 g, in 90% yield).

Example 1.1.3

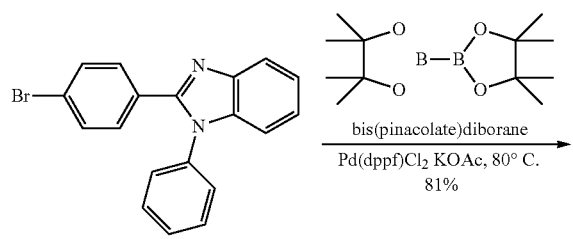

1-phenyl-2-(4-(4,4,5,5-tetramethyl-1,3,2-dioxaborolan-2-yl)phenyl)-1H-benzo[d]imidazole (Compound 3)

A mixture of Compound 2 (0.70 g, mmol), bis(pinacolate)diborane (0.533 g, 2.1 mmol), bis(diphenylphosphino)ferrocene]dichloropalladium (Pd(dppf)Cl$_2$) (0.060 g, 0.08 mmol) and anhydrous potassium acetate (KOAc) (0.393 g, 4 mmol) in 1,4-dioxane (20 ml) was heated at about 80° C. under argon overnight. After cooling to RT, the whole was diluted with ethyl acetate (80 ml) then filtered. The solution was absorbed on silica gel, then purified by column chromatography (hexanes/ethyl acetate 5:1 to 3:1) to give a white solid 3 (0.64 g, in 81% yield).

Example 1.1.4

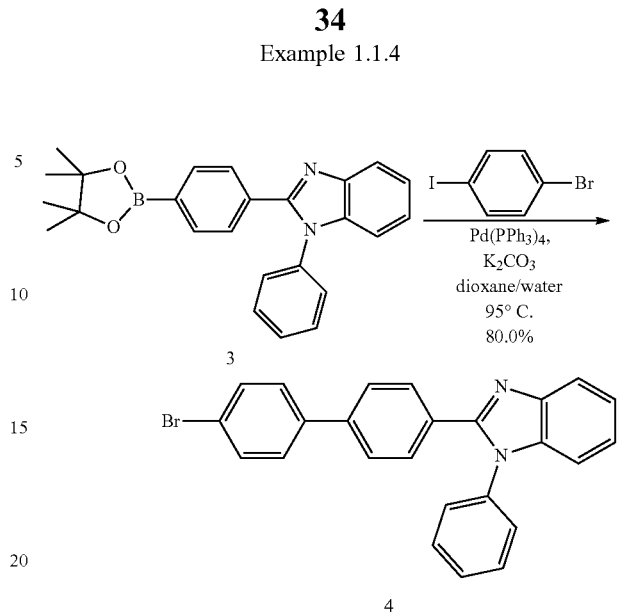

2-(4'-bromo-[1,1'-biphenyl]-4-yl)-1-phenyl-1H-benzo[d]imidazole (Compound 4)

A mixture of Compound 3 (4.01 g, 10.1 mmol), 1-bromo-4-iodobenzene (5.73 g, 20.2 mmol), Pd(PPh$_3$)$_4$ (0.58 g, 0.5 mmol) and potassium carbonate (4.2 g, 30 mmol) in dioxane/water (60 ml/10 ml) was degassed and heated at about 95° C. overnight. After being cooled to RT, the mixture was poured into ethyl acetate (250 ml), washed with brine, dried over Na$_2$SO$_4$, then loaded on silica gel, purified by flash column (hexanes to hexanes/ethyl acetate 4:1) to give a light yellow solid washed with methanol and dried in air (3.39 g, in 80% yield).

Example 1.1.5

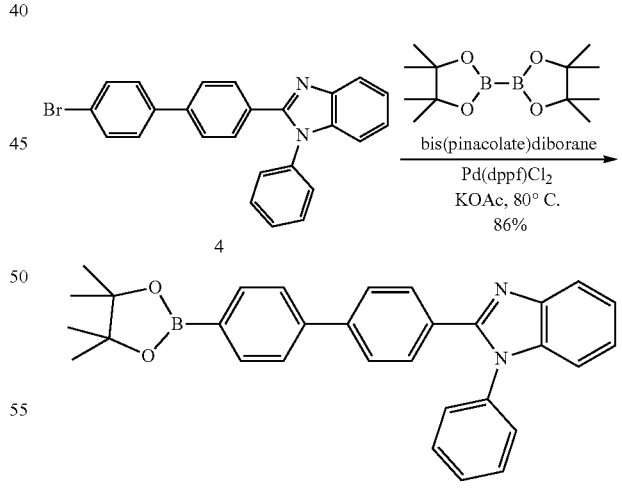

1-phenyl-2-(4'-(4,4,5,5-tetramethyl-1,3,2-dioxaborolan-2-yl)-[1,1'-biphenyl]-4-yl)-1H-benzo[d]imidazole (Compound 5)

A mixture of Compound (1.2 g, 2.82 mmol), bis(pinacolate)diborane (0.72 g, 2.82 mmol), bis(diphenylphosphino)

ferrocene]dichloropalladium (Pd(dppf)Cl$_2$) (0.10 g, 0.14 mmol) and anhydrous potassium acetate (KOAc) (2.0 g, 20 mmol) in 1,4-dioxane (45 ml) was heated at about 80° C. under argon overnight. After cooling to RT, the whole was diluted with ethyl acetate (150 ml) then filtered. The solution was absorbed on silica gel, then purified by column chromatography (hexanes/ethyl acetate 5:1 to 3:1) to give a white solid 5 (1.14 g, in 86% yield).

Example 1.2

Example 1.2.1

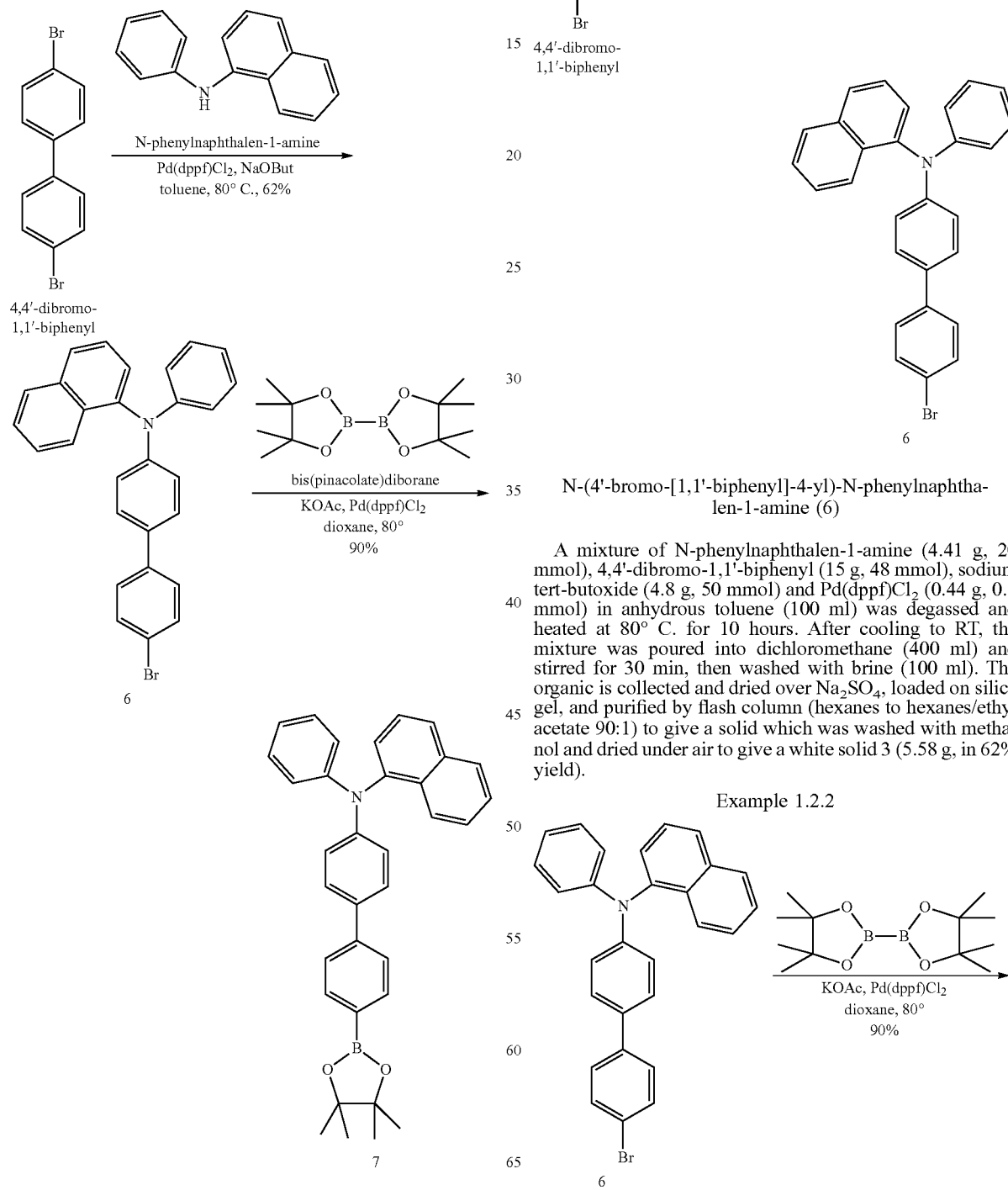

N-(4'-bromo-[1,1'-biphenyl]-4-yl)-N-phenylnaphthalen-1-amine (6)

A mixture of N-phenylnaphthalen-1-amine (4.41 g, 20 mmol), 4,4'-dibromo-1,1'-biphenyl (15 g, 48 mmol), sodium tert-butoxide (4.8 g, 50 mmol) and Pd(dppf)Cl$_2$ (0.44 g, 0.6 mmol) in anhydrous toluene (100 ml) was degassed and heated at 80° C. for 10 hours. After cooling to RT, the mixture was poured into dichloromethane (400 ml) and stirred for 30 min, then washed with brine (100 ml). The organic is collected and dried over Na$_2$SO$_4$, loaded on silica gel, and purified by flash column (hexanes to hexanes/ethyl acetate 90:1) to give a solid which was washed with methanol and dried under air to give a white solid 3 (5.58 g, in 62% yield).

Example 1.2.2

N-phenyl-N-(4'-(4,4,5,5-tetramethyl-1,3,2-dioxaborolan-2-yl)-[1,1'-biphenyl]-4-yl)naphthalen-1-amine (7)

A mixture of Compound 6 (5.5 g, 12.2 mmol), bis(pinacolate)diborane (3.10 g, 12.2 mmol), Pd(dppf)Cl$_2$ (0.446 mg, 0.6 mmol) and KOAc (5.5 g, 56 mmol) in anhydrous dioxane (60 ml) was degassed and heated at 80° C. overnight. After being cooled to RT, the mixture was poured into ethyl acetate (200 ml), washed with brine (150 ml). The organic solution was dried over Na$_2$SO$_4$, loaded on silica gel and purified by flash column (hexanes to hexanes/ethyl acetate 30:1) to collect the major fraction. After removal of solvent, the solid was washed with methanol, filtered and dried in air to give a white solid 7 (5.50 g, in 90% yield).

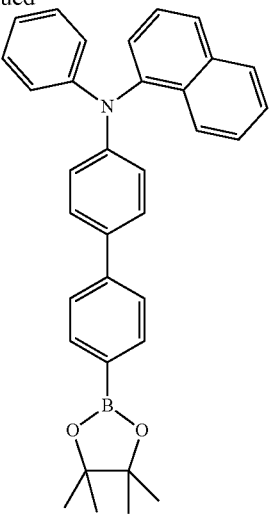

7

Example 1.3

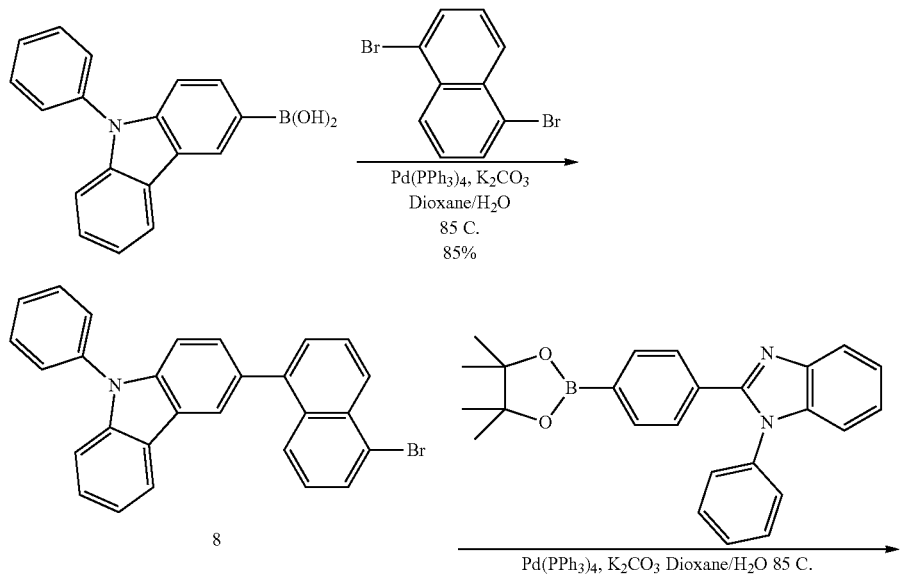

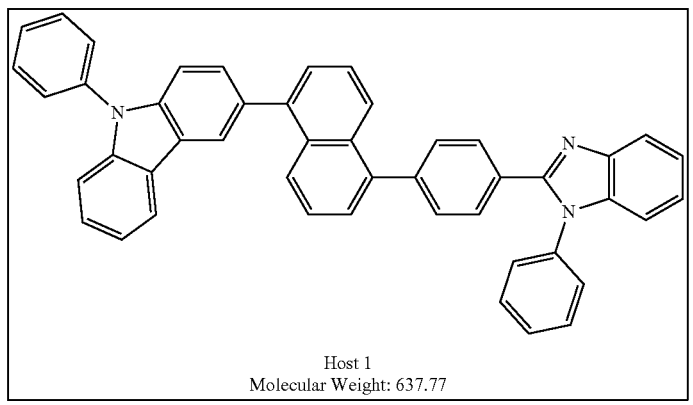

Host 1
Molecular Weight: 637.77

Example 1.3.1

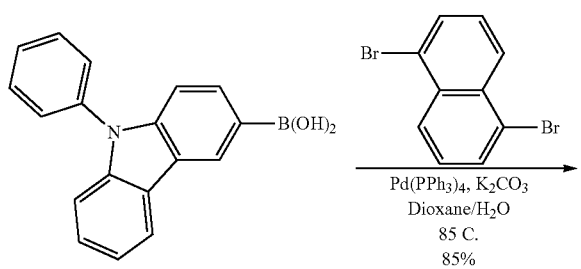

3-(5-bromonaphthalen-1-yl)-9-phenyl-9H-carbazole (8)

A mixture of (9-phenyl-9H-carbazol-3-yl)boronic acid (2.87 g, 10 mmol), 1,5-dibromonaphthalene (2.86 g, 10 mmol), Pd(PPh$_3$)$_4$ (0.335 g, 0.29 mmol) and potassium carbonate (4.14 g, 30 mmol) in dioxane/water (50 mL/10 mL) was degassed and heated at 85° C. overnight. The resulting mixture was worked up with ethyl acetate/brine, dried over Na$_2$SO$_4$, purified by flash column (hexanes to hexane/ethyl acetate 40:1) to give a white solid (3.47 g, 65% yield).

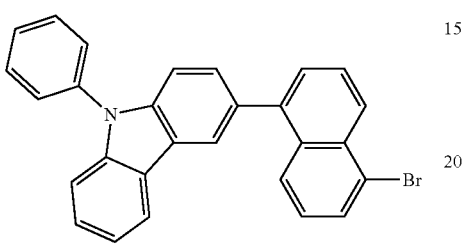

8

Example 1.3.2

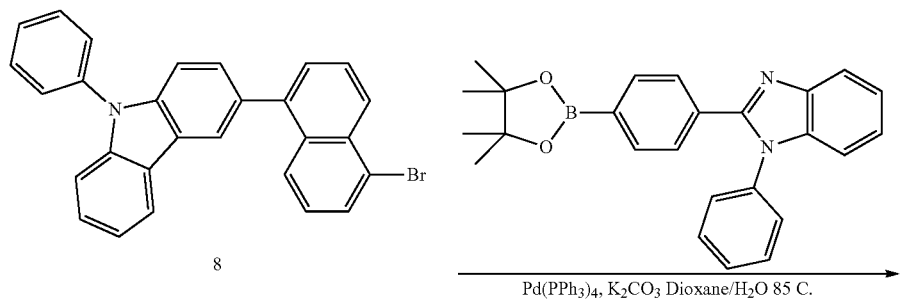

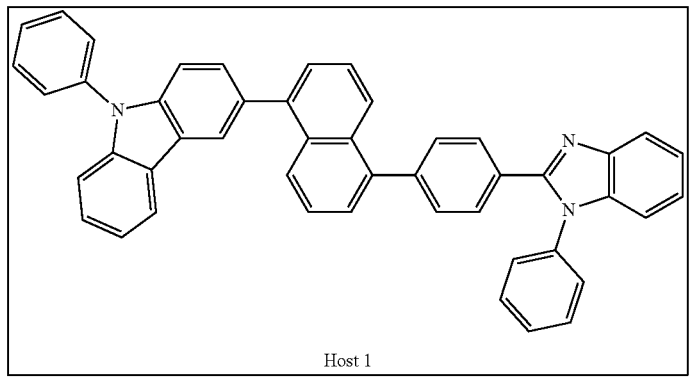

Host 1

Host 1:

A mixture of compound 3 (1.19 g, 3.0 mmol), compound 8 (1.71 g, 3.11 mmol), Pd(PPh₃)₄ (0.20 g, 0.17 mmol) and potassium acetate (1.38 g, 10 mmol) in dioxane/water (50 mL/10 mL) was degassed and heated at 85° C. overnight. The resulting mixture was worked up with ethyl acetate/brine. The organic phase was dried over Na₂SO₄, purified by flash column (hexanes to hexanes/ethyl acetate 40:1 to 20:1 to 9:1 to 8:1). The desired fraction was collected and concentrated. A white solid was obtained through filtration, 1.40 g, in 73% yield. Confirmed by LCMS (APCI): calculated for $C_{47}H_{32}N_3$ (M+H): 638; found: 638.

Example 1.4

Example 1.4.1

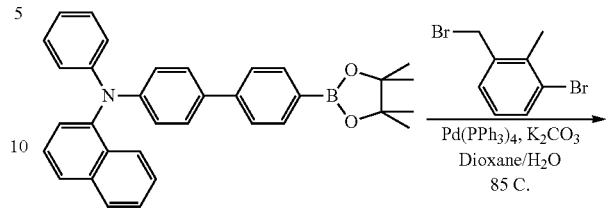

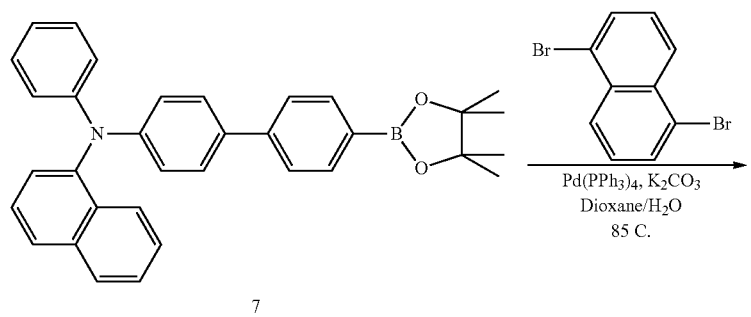

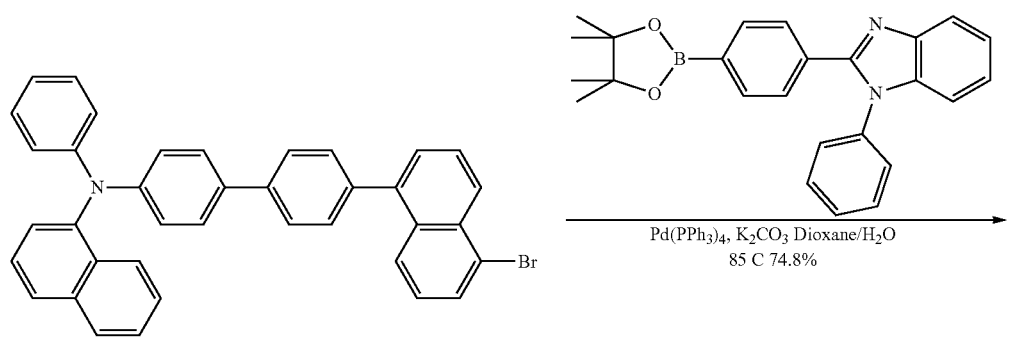

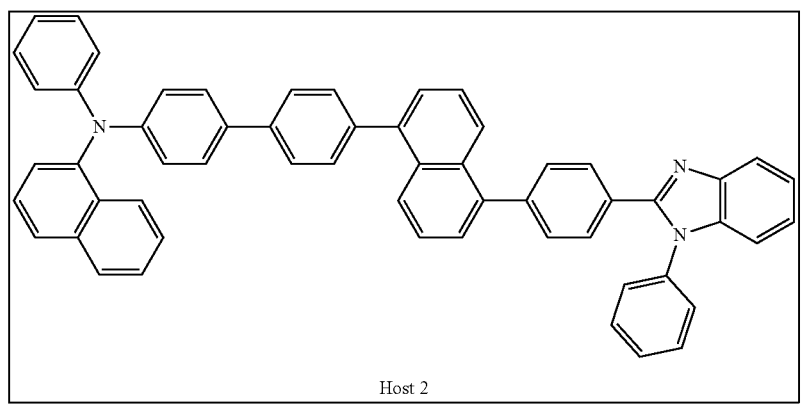

Host 2

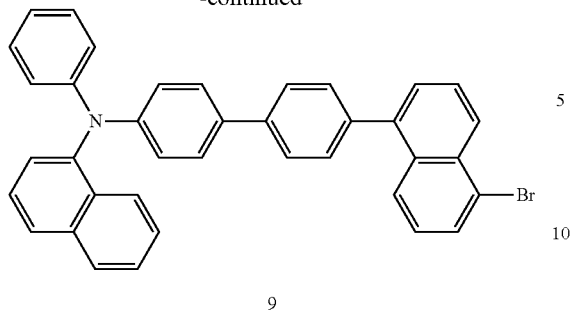

9

N-(4'-(5-bromonaphthalen-1-yl)-[1,1'-biphenyl]-4-yl)-N-phenylnaphthalen-1-amine (9)

A mixture of compound 7 (3.02 g, 6.08 mmol), 1,5-dibromonaphthalene (1.74 g, 6.08 mmol), Pd(PPh$_3$)$_4$ (0.346 g, 0.3 mmol) and potassium carbonate (2.48 g, 18 mmol) in dioxane/water (50 mL/10 mL) was degassed and heated at 85° C. overnight. The resulting mixture was worked up with dichloromethane/brine. The organic phase was purified by flash column (hexanes to hexanes/ethyl acetate 40:1) to give a white solid (2.08 g, in 59% yield).

Example 1.4.2

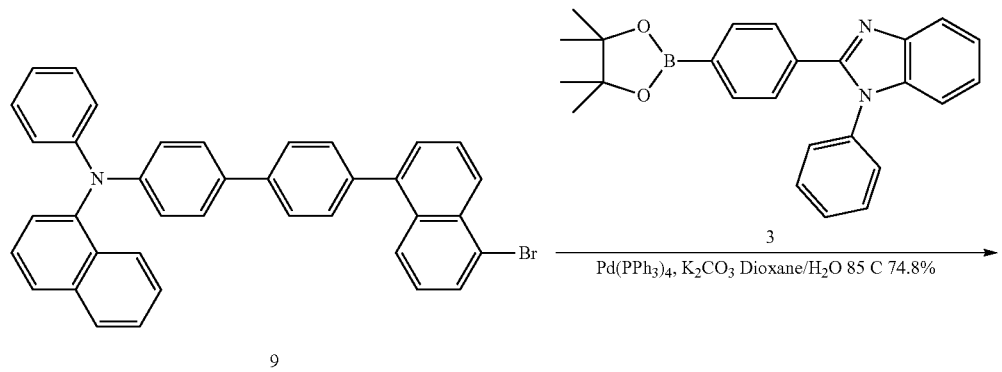

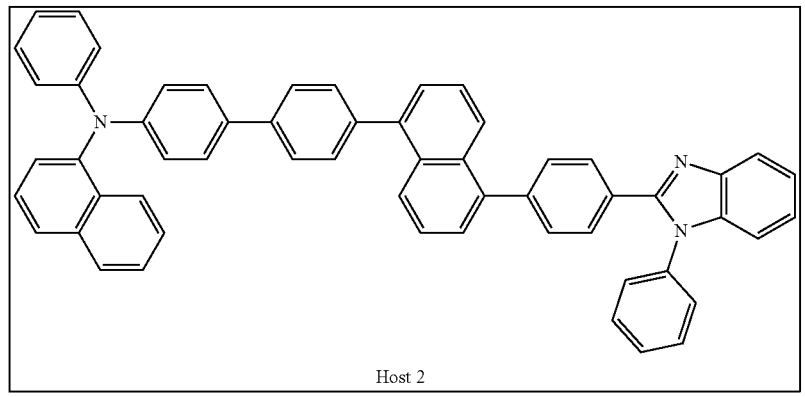

Host 2:

A mixture of compound 9 (1.731 g, 3.0 mmol), compound 3 (1.188 g, 3.0 mmol), Pd(PPh₃)₄ (0.2 g, 0.17 mmol) and potassium acetate (1.38 g, 10 mmol) in dioxane/water (50 mL/10 mL) was degassed and heated at 90° C. overnight. The resulting mixture was poured into ethyl acetate (150 mL), washed with brine, dried over Na₂SO₄, and purified by flash column (hexanes to hexanes/ethyl acetate 20:1 to 9:1 to 4:1). The major fraction was collected and concentrated to give a white solid (1.72 g, 74.8% yield). Confirmed by LCMS (APCI): Calculated for $C_{57}H_{40}N_3$(M+H): 766. Found: 766.

Example 1.5

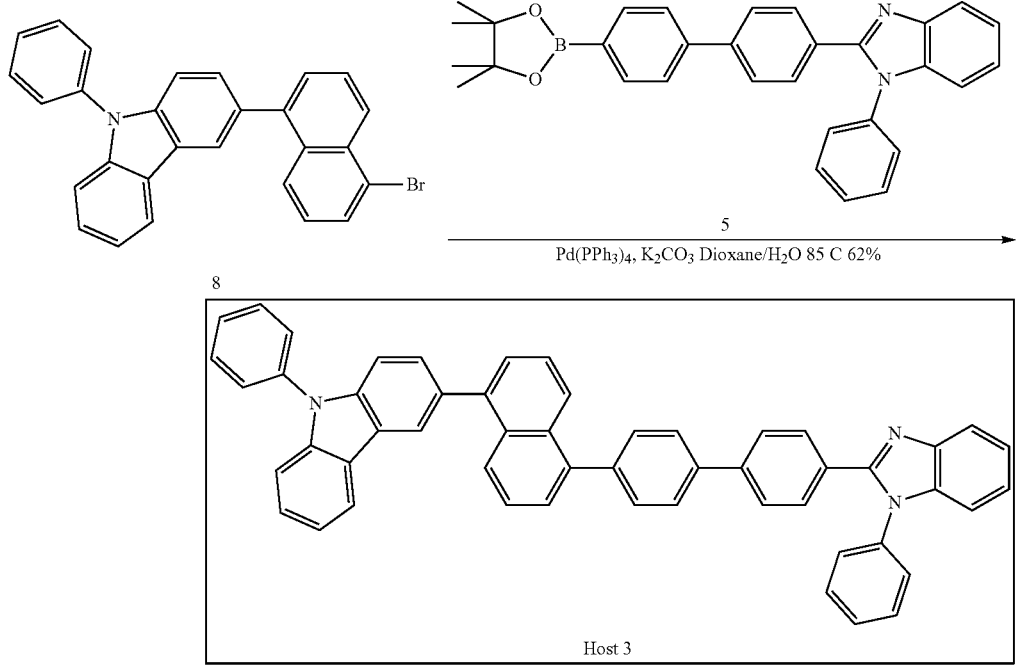

Host 3:

A mixture of compound 8 (1.57 g, 3 mmol), compound 5 (1.42 g, 3 mmol), Pd(PPh₃)₄ (0.2 g, 0.17 mmol) and potassium acetate (1.38 g, 10 mmol) in dioxane/water (50 mL/10 mL) was degassed and heated at 90 C overnight. The mixture was worked up with ethyl acetate/brine, dried over Na₂SO₄ and purified by flash column (hexanes to hexanes/ethyl acetate 20:1 to 9:1 to 4:1) to give a white solid (1.32 g, in 62% yield). Confirmed by LCMS (APCI): calculated for $C_{53}H_{36}N_3$ (M+H): 714; found: 714.

8.2. Physical Properties of the New Materials

TABLE 1

| | HOMO (eV) | LUMO (eV) | T1 (eV) | λ em (nm) | Tg (° C.) |
|---|---|---|---|---|---|
| Host 1 | −5.6 | −2.28 | 2.40 | 415 | 135 |

TABLE 1-continued

|  | HOMO (eV) | LUMO (eV) | T1 (eV) | λ em (nm) | Tg (° C.) |
|---|---|---|---|---|---|
| Host 2 | −5.38 | −2.29 | 2.38 | 425 | 133 |
| Host 3 | −5.57 | −2.32 | 2.41 | 413 | 145 |

8-3. Example of OLED Device Configuration and Performance

Example 2.1

(Device-A)

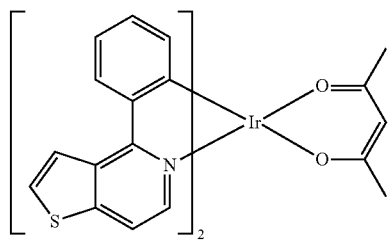

YE-1

Fabrication of light-emitting device:

A device was fabricated in the following manner. The ITO substrates having sheet resistance of about 14 ohm/sq was cleaned ultrasonically and sequentially in detergent, water, acetone and then IPA; and then dried in an oven at about 80° C. for about 30 min under ambient environment. Substrates was baked at about 200° C. for about 1 hour in an ambient environment, then under UV-ozone treatment for about 30 minutes. PEDOT:PSS (hole-injection material) was then spin-coated on the substrate at about 5000 rpm for about 30 sec. The coated layer was then baked at about 100° C. for 30 min in an ambient environment, followed by baking at 200° C. for 30 min inside a glove box ($N_2$ environment). The substrate was then transferred into a vacuum chamber, where NPB was vacuum deposited at a rate of about 0.1 nm/s under a base pressure of about $2\times10^{-7}$ torr. "YE-1" (10 wt %) was be co-deposited as an emissive layer with Host 1 material at about 0.01 nm/s and about 0.10 nm/s, respectively, to make the appropriate thickness ratio. 1,3,5-Tris(1-phenyl-1H-benzimidazol-)2-yl)benzene (TPBI) was then deposited at about 0.1 nm/s rate on the emissive layer. A layer of lithium fluoride (LiF) (electron injection material) was deposited at about 0.005 nm/s rate followed by deposition of the cathode as Aluminium (Al) at about 0.3 nm/s rate. The representative device structure was: ITO (about 110 nm thick)/PEDOT:PSS (about 30 nm thick)/NPB (about 30 nm thick)/Host 1:YE-1 (about 30 nm thick)/TPBI (about 30 nm thick)/LiF(about 1.0 nm thick)/Al (about 100 nm thick). The device was then encapsulated with a glass cap to cover the emissive area of the OLED device in order to protect from moisture, oxidation or mechanical damage. Additional devices were prepared in the same manner, using Host 2 (Device 2) or Host 3 (Device 3) instead of Host 1. Each individual device was an area of about 0.14 cm². Devices 2 and 3, made in the above described manner were tested for device luminescence efficiency (LE) (cd/A), power efficiency (PE) (lm/watt); change in voltage after 20 hours of 2 mA; and device lifetime at 10 Knit and 1 Knit. The results are shown in FIG. 2.

It will be understood by those of skill in the art that numerous and various modifications can be made without departing from the spirit of the present invention. Therefore, it should be clearly understood that the forms of the present invention are illustrative only and are not intended to limit the scope of the present invention Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

The terms "a," "an," "the" and similar referents used in the context of describing the invention (especially in the context of the following claims) are to be construed to cover both the singular and the plural, unless otherwise indicated herein or clearly contradicted by context. All methods described herein can be performed in any suitable order unless otherwise indicated herein or otherwise clearly contradicted by context. The use of any and all examples, or exemplary language (e.g., "such as") provided herein is intended merely to better illuminate the invention and does not pose a limitation on the scope of any claim. No language in the specification should be construed as indicating any non-claimed element essential to the practice of the invention.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Certain embodiments are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the invention to be practiced otherwise than specifically described herein. Accordingly, the claims include all modifications and equivalents of the subject matter recited in the claims as permitted by applicable law. Moreover, any combination of the above-described elements in all possible variations thereof is contemplated unless otherwise indicated herein or otherwise clearly contradicted by context.

In closing, it is to be understood that the embodiments disclosed herein are illustrative of the principles of the claims. Other modifications that may be employed are within the scope of the claims. Thus, by way of example, but not of limitation, alternative embodiments may be utilized in accordance with the teachings herein. Accordingly, the claims are not limited to embodiments precisely as shown and described.

What is claimed:

1. A host compound for use in emissive elements of organic light emitting devices, the compound being represented by Formula 1:

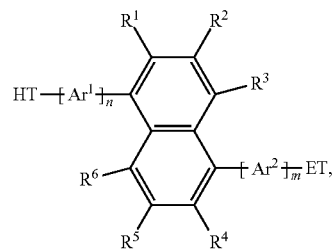

wherein $R^1$, $R^2$, $R^3$, $R^4$, $R^5$, and $R^6$ are independently H, $C_1$-$C_3$ alkyl, or $C_{1-3}$ perfluoroalkyl;

wherein $Ar^1$ and $Ar^2$ are independently optionally substituted 1,4-interphenylene or 1,3-interphenylene, wherein n is 0, 1, or 2; and m is 0, 1, or 2;

HT is

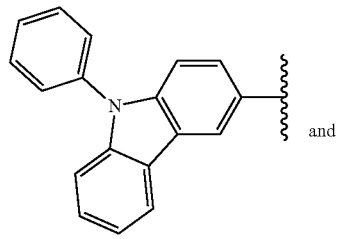 [SMILES: *c1ccc2c(c1)c1ccccc1n2-c1ccccc1]

and

ET is optionally substituted 3,3'-bipyridin-5-yl, optionally substituted quinolin-8-yl, optionally substituted quinolin-5-yl, or optionally substituted quinoxalin-5-yl.

2. The host compound of claim 1, wherein $R^1$, $R^2$, $R^3$, $R^4$, $R^5$ and $R^6$ are H.

3. A light emitting emissive element comprising the host compound of claim 1.

4. An organic light-emitting diode device comprising:
a cathode;
an anode; and
a light-emitting layer disposed between and electrically connected to the anode and the cathode, wherein the light-emitting layer comprises a host compound according to claim 1.

5. The organic light-emitting diode device of claim 4, further comprising a hole-transport layer between the anode and the light-emitting layer and an electron-transport layer between the cathode and the light-emitting layer.

6. The organic light-emitting diode device of claim 5, wherein all of the light-emitting layer, the hole-transport layer and the electron-transport layer comprise the host compound according to claim 1.

7. The organic light-emitting diode device of claim 4, wherein $R^1$, $R^2$, $R^3$, $R^4$, $R^5$, and $R^6$ are H.

8. The organic light-emitting diode device of claim 4, wherein the light-emitting layer further comprises an emissive component.

9. The organic light-emitting diode device of claim 8, wherein the emissive component comprises a phosphorescent material.

10. The organic light-emitting diode device of claim 4, wherein ET is unsubstituted.

* * * * *